(12) United States Patent
Lunt, III et al.

(10) Patent No.: US 11,114,623 B2
(45) Date of Patent: Sep. 7, 2021

(54) ORGANIC SALTS FOR HIGH VOLTAGE ORGANIC AND TRANSPARENT SOLAR CELLS

(71) Applicant: Board of Trustees of Michigan State University, East Lansing, MI (US)

(72) Inventors: Richard R. Lunt, III, Williamston, MI (US); John Suddard-Bangsund, Monticello, MN (US); Christopher Traverse, Haslett, MI (US); Margaret Young, Troy, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 38 days.

(21) Appl. No.: 15/791,949

(22) Filed: Oct. 24, 2017

(65) Prior Publication Data
US 2018/0108846 A1    Apr. 19, 2018

Related U.S. Application Data

(63) Continuation of application No. PCT/US2016/026169, filed on Apr. 6, 2016.

(60) Provisional application No. 62/153,299, filed on Apr. 27, 2015.

(51) Int. Cl.
*H01L 51/00* (2006.01)
*C09B 23/16* (2006.01)
*H01L 51/42* (2006.01)

(52) U.S. Cl.
CPC ........ *H01L 51/0064* (2013.01); *C09B 23/166* (2013.01); *H01L 51/002* (2013.01); *H01L 51/006* (2013.01); *H01L 51/4246* (2013.01); *H01L 51/008* (2013.01); *H01L 51/0046* (2013.01); *H01L 51/424* (2013.01);
(Continued)

(58) Field of Classification Search
None
See application file for complete search history.

(56) References Cited

U.S. PATENT DOCUMENTS

| 2006/0112983 A1 | 6/2006 | Parce et al. |
| 2007/0140962 A1 | 6/2007 | Achilefu et al. |
| 2009/0235988 A1 | 9/2009 | Jenekhe et al. |

(Continued)

FOREIGN PATENT DOCUMENTS

| CN | 101107258 A | 1/2008 |
| CN | 103534831 A | 1/2014 |

(Continued)

OTHER PUBLICATIONS

Strategies to improve cyanine dye multilayer organic solar cells, Hany et al., Prog PV Res. Appl. 2011, 19; 851-857 (Year: 2011).*

(Continued)

*Primary Examiner* — Shannon M Gardner
(74) *Attorney, Agent, or Firm* — Harness, Dickey & Pierce, PLC

(57) ABSTRACT

Photo-active devices including a substrate, a first electrode, an active layer including an organic salt or salt mixture that selectively or predominantly harvests light from the near infrared or infrared regions of the solar spectrum, and a second electrode. The devices are either visibly transparent or visibly opaque and can be utilized in single- or multi-junction devices.

20 Claims, 20 Drawing Sheets

(52) U.S. Cl.
CPC ....... *H01L 2251/308* (2013.01); *Y02E 10/549* (2013.01); *Y02P 70/50* (2015.11)

(56) References Cited

U.S. PATENT DOCUMENTS

| | | |
|---|---|---|
| 2011/0086302 A1 | 4/2011 | Zhou et al. |
| 2013/0104983 A1 | 5/2013 | Abrams et al. |
| 2014/0148425 A1 | 5/2014 | Bonnet |

FOREIGN PATENT DOCUMENTS

| | | |
|---|---|---|
| CN | 103606633 A | 2/2014 |
| CN | 104272485 A | 1/2015 |
| JP | 2005116367 A | 4/2005 |
| JP | 2008528706 A | 7/2008 |
| JP | 4258656 B2 | 4/2009 |
| JP | 2013506278 A | 2/2013 |
| JP | 2015-032606 | 2/2015 |
| WO | WO-2004/084272 A2 | 9/2004 |
| WO | WO-2006073562 A2 | 7/2006 |
| WO | WO-2006082945 A2 | 8/2006 |
| WO | WO-2012063964 A1 | 5/2012 |
| WO | WO-2013/102985 A1 | 7/2013 |
| WO | WO-2013/167224 A1 | 11/2013 |

OTHER PUBLICATIONS

Veron et al., NIR-Absorbing heptamethine dyes with tailor-made counterions for application in light to energy conversion, organic letters 2014, 16, 1044-1047 (Year: 2014).*
International Search Report and Written Opinion for PCT/US2016/026169, dated Jul. 12, 2016, ISA/US.
International Preliminary Report on Patentability for PCT/US2016/026169, dated Jan. 27, 2017, ISA/US.
Bates, M. and Lunt, R. R., "Organic salt photovoltaics," Sustainable Energy & Fuels, 2017 (14 pages).
Bertolino, C. A. et al., "Novel heptamethine cyanine dyes with large Stoke's shift for biological applications in the near infrared." J. Fluoresc., 2006, vol. 16, p. 221.
Bouit, P.-A. et al., "Continuous Symmetry Breaking Induced by Ion Pairing Effect in Heptamethine Cyanine Dyes: Beyond the Cyanine Limit." J. Am. Chem. Soc., 2010, vol. 132, pp. 4328-4335.
Fan, B. et al., "High performing doped cyanine bilayer solar cell." Organic Electronics, 2010, vol. 11, pp. 583-588.
Hany, R. et al., "Strategies to improve cyanine dye multi layer organic solar cells." Progress in Photovoltaics: Research and Applications, 2011, vol. 19, No. 7, pp. 851-857.
Lunt, R. et al., "Practical Roadmap and Limits to Nanostructured Photovoltaics" (Perspective) Adv. Mat. 23, 2011, pp. 5712-5727.
Malinkiewicz, O. et al., "Efficient, Cyanine Dye Based Bilayer Solar Cells." Adv. Energy Mater., 2013, vol. 3, pp. 472-477.
Véron, A.C. et al., "NIR-Absorbing Heptamethine Dyes with Tailor-Made Counterions for Application in Light to Energy Conversion." Org. Lett., 2014, vol. 16, pp. 1044-1047.
Zhang, H. et al., "Semitransparent organic photovoltaics using a near-infrared absorbing cyanine dye." Solar Energy Materials and Solar Cells, 2013, vol. 118, pp. 157-164.
Office Action dated Feb. 26, 2019 in corresponding Chinese Patent Application No. 201680035912.X. Summary translation provided by Shanghai Beshining Law Office. (9 pages).
Extended European Search Report dated Dec. 12, 2018 in corresponding European Patent Application No. 16786905.6 (5 pages).
Qin, C. et al., "Novel Near-Infrared Squaraine Sensitizers for Stable and Efficient Dye-Sensitized Solar Cells." Advanced Functional Materials, 2014, vol. 24, pp. 3059-3066.
Office Action dated Oct. 16, 2019 in corresponding Chinese Patent Application No. 201680035912.X. Summary translation provided by Shanghai Beshining Law Office (11 pages).
Office Action dated Jan. 28, 2020 in corresponding Japanese Patent Application No. 2017-556155. Summary translation provided by Harakenzo World Patent & Trademark (10 pages).
Wicht, G. et al., "Stability of bilayer trimethine cyanine dye/fullerene organic solar cells." Solar Energy Materials and Solar Cells, 2013, vol. 117, pp. 585-591.
Office Action dated May 26, 2020 in corresponding Chinese Patent Application No. 201680035912.X. Summary translation provided by Shanghai Beshining Law Office (6 pages).
Office Action dated Aug. 18, 2020 in corresponding Japanese Patent Application No. 2017-556155. Summary translation provided by Harakenzo World Patent & Trademark (4 pages).
De Jonghe-Risse, J. et al., "Ultrafast charge transfer in solid-state films of pristine cyanine borate and blends with fullerene." Journal of Materials Chemistry A, 2015, vol. 3, pp. 10935-10941.
Rand, B. P. et al., "Offset energies at organic semiconductor heterojunctions and their influence on the open-circuit voltage of thin-film solar cells." Physical Review B, 2007, vol. 75, No. 11, pp. 115327-1-115327-11.
Wang, Y. et al., "Dye Sensitization in the Visible Region for Low-Bandgap Polymer Solar Cells." Journal of the Electrochemical Society, 2014, vol. 161, No. 7, pp. D3093-D3096.
Office Action dated May 11, 2021 in corresponding Japanese Patent Application No. 2017-556155, and English language summary.

* cited by examiner

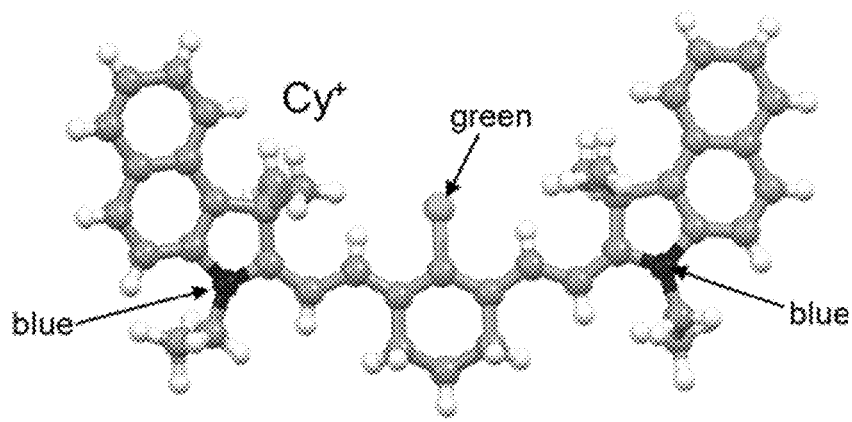
Fig. 2A
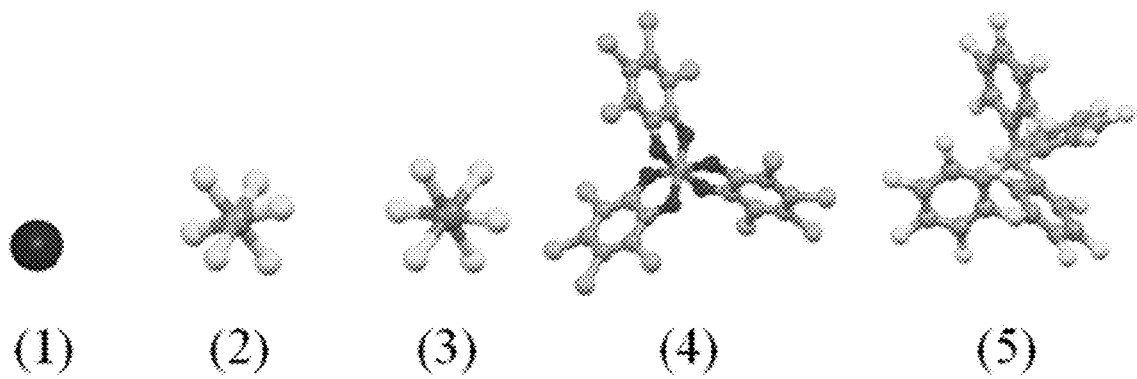
Fig. 2B
| ITO (100 nm) |
| MoO$_3$ (100 nm) |
| Ag (2 nm or 100nm) |
| BCP (7.5 nm) |
| C$_{60}$ (40 nm) |
| CyX (8 – 30 nm) |
| MoO$_3$ (10 nm) |
| ITO (120 nm) |
Fig. 2C

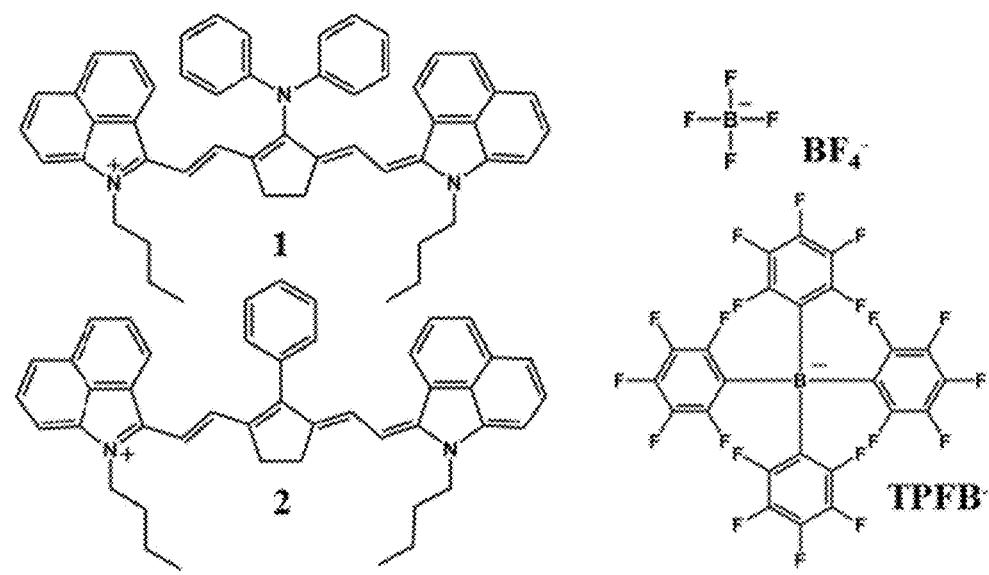
Fig. 16A
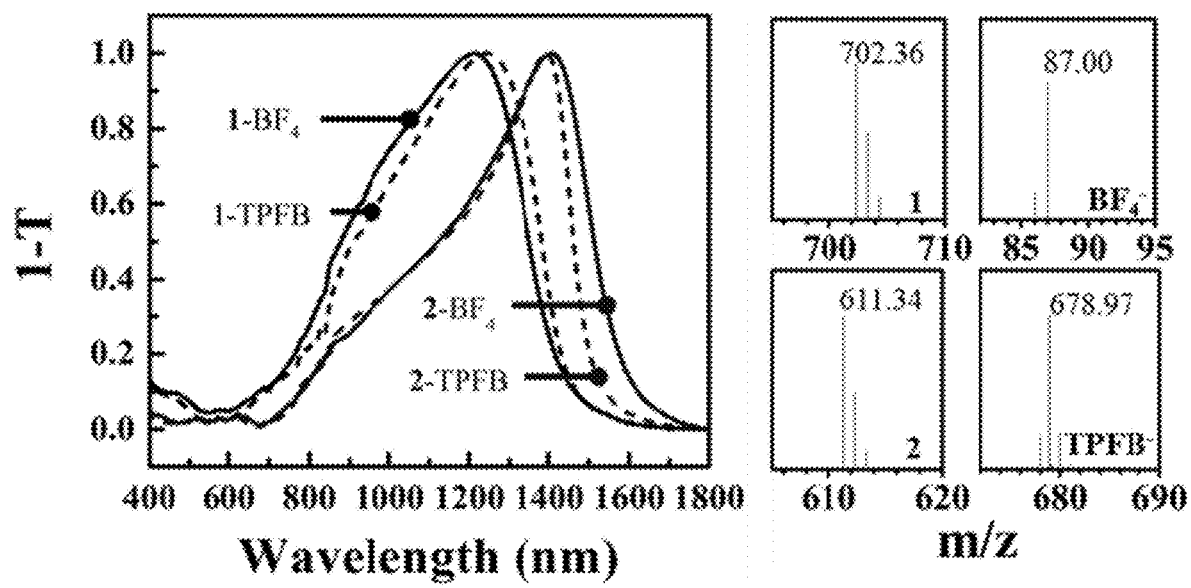
Fig. 16B
Fig. 16C

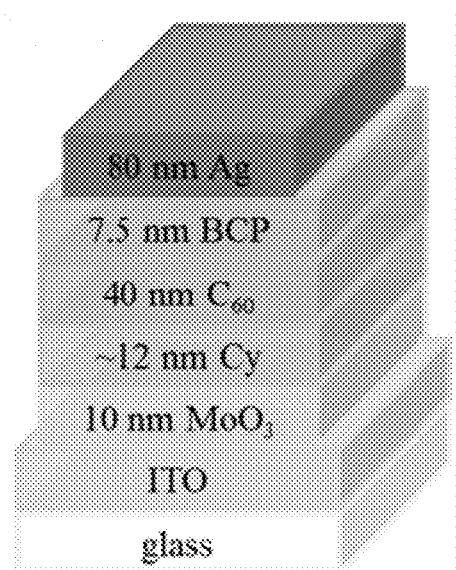
Fig. 17A
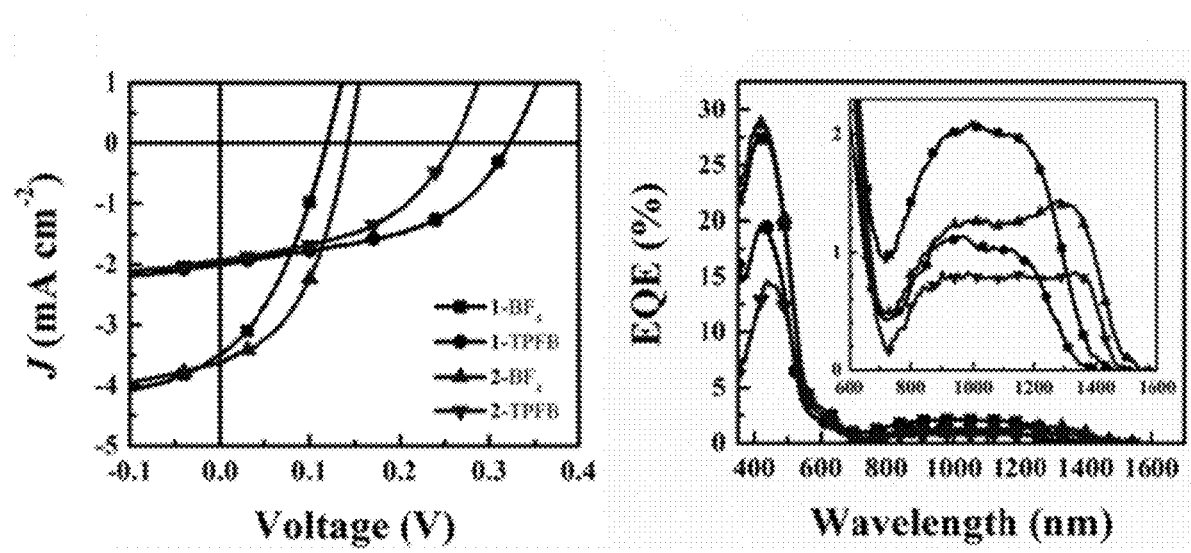
Fig. 17B
Fig. 17C

ORGANIC SALTS FOR HIGH VOLTAGE ORGANIC AND TRANSPARENT SOLAR CELLS

CROSS-REFERENCE TO RELATED APPLICATIONS

This application is a continuation application of PCT International Patent Application Serial No. PCT/US2016/026169 filed on Apr. 6, 2016, which claims the benefit of U.S. Provisional Application No. 62/153,299, filed on Apr. 27, 2015, both of which are incorporated by reference herein.

GOVERNMENT RIGHTS

This invention was made with government support under CBET1254662 awarded by the National Science Foundation. The government has certain rights in the invention.

FIELD

The present disclosure relates to organic small molecule salts that can harvest extended near-infrared light for efficient organic, transparent, and multijunction photovoltaic and photodetector devices.

BACKGROUND

This section provides background information related to the present disclosure which is not necessarily prior art.

Organic Photovoltaics (OPVs) are rapidly approaching commercial viability because of their potential for inexpensive, high-throughput manufacturing and unique applications, such as flexible and transparent solar cells. Compared to conventional inorganic cells, however, OPVs are typically limited by spectral overlap with the sun. Few molecules have been demonstrated with efficient photoconversion past 900 nm, leaving almost half the incident solar photon flux unutilized. Molecules with absorption in this region often suffer from low open-circuit voltages (VOCs). For example, SnPc and PbPc, which have absorption cut-offs near 950 nm and 1000 nm, exhibit VOCs of 0.42 V and 0.47 V, respectively, nearly half of the realistic excitonic voltage limit. Because of this voltage limitation and limited spectral coverage, current demonstrations of Transparent Organic Photovoltaics (TPVs) with high transparency have been limited to 2-4%. Expanding the catalog of efficient NIR molecules would help advance the performance of panchromatic tandem cells and single- and multi-junction transparent photovoltaics.

Polymethines are one of the most promising classes of molecules to satisfy the need for efficient, NIR-harvesting and visibly transparent NIR-harvesting compounds. Polymethines are a class of ionic organic salts that have gained attention for photovoltaic applications due to their tunable absorption, high extinction coefficients, and high solubility. Recently, polymethines with absorption maxima in the near-infrared have been employed in OPV devices with efficiencies of 1.5-2.8% for opaque devices, 0.9-2.2% for semitransparent devices, and transparent luminescent solar concentrators.

Recent efforts to improve cyanine photovoltaics are focused on studying the influence of the cation chemistry and counterions of larger gap molecules on device performance, optical properties, and solid state packing. For instance, $PF_6^-$ exhibits higher fill factors than $ClO_4^-$ in bilayer devices. Also, exchanging $PF_6^-$ for Δ-TRISPHAT, a bulky, chiral anion with fluorinated phenyl groups, Voc and Jsc could be enhanced by nearly 50% in larger gap systems. The selection of Δ-TRISPHAT as a suitable counterion was made based upon a photophysical and structural study which showed that the Δ-TRISPHAT counterion reduced polarization of the cyanine cation in the solid state and exhibited near zero bond length alternation (BLA). Harder counterions such as $Br^-$, $I^-$, and $PF_6^-$ showed BLAs of 2-6 pm. Nonetheless, there remains a need to develop new organic small molecule salts that can harvest extended near-infrared light for efficient organic, transparent, and multijunction photovoltaic devices and detectors.

SUMMARY

This section provides a general summary of the disclosure, and is not a comprehensive disclosure of its full scope or all of its features.

The present technology provides a photo-active device that includes a substrate, a first electrode deposited within the substrate or on at least one surface of the substrate, an active layer comprising an organic salt and optionally a complimentary electron donor or electron acceptor, and a second electrode. The organic salt selectively absorbs light in the near infrared or infrared regions of the solar spectrum. In various embodiments, the organic salt includes a polymethine derivative organic cation.

The present technology also provides a photo-active device that has an active layer having an organic salt. The organic salt includes a counterion, wherein the counterion is selected from halides, aryl borates, carboranes, (∧,R)-(1,1'-binaphthalene-2,2'diolato)(bis(tetrachlor-1,2-benzenediolato)phosphate(V)) (BINPHAT), [Δ-tris(tetrachloro-1,2-benzenediolato)phosphate(V)] (TRISPHAT), fluoroantimonates; fluorophosphates, fluoroborates, derivatives thereof, and combinations thereof. The organic salt also includes a cation, such as a polymethine cation or cyanine cation.

Additionally, the current technology provides a photo-active device that includes an active layer having a polymethine salt. The polymethine salt includes a cation and a counterion. In various embodiments, the photo-active device is a visibly transparent or visibly opaque photovoltaic or a visibly transparent or visibly opaque photodetector.

Further, the present technology provides a method of manufacturing a photo-active device. The method includes blending together at least two organic salts to generate an anion alloy, wherein the organic salts have the same cation, but different anions, and disposing the anion alloy-cation pair between a first electrode and a second electrode. In various embodiments, the at least two organic salts have different anions individually selected from the group consisting of $F^-$, $I^-$, and $Br^-$; aryl borates, such as tetraphenylborate, tetra(p-tolyl)borate, tetrakis(4-biphenylyl)borate, tetrakis(1-imidazolyl)borate, tetrakis(2-thienyl)borate, tetrakis(4-chlorophenyl)borate, tetrakis(4-fluorophenyl)borate, tetrakis(4-tert-butylphenyl)borate, tetrakis(pentafluorophenyl)borate (TPFB), tetrakis[3,5-bis(trifluoromethyl)phenyl]borate (TFMPB), [4-[bis(2,4,6-trimethylphenyl)phosphino]-2,3,5,6-tetrafluorophenyl]hydrobis(2,3,4,5,6-pentafluorophenyl)borate, [4-di-tert-butylphosphino-2,3,5,6-tetrafluorophenyl]hydrobis(2,3,4,5,6-pentafluorophenyl)borate; carboranes, (∧,R)-(1,1'-binaphthalene-2,2'diolato)(bis(tetrachlor-1,2-benzenediolato)phosphate(V)) (BINPHAT), [Δ-tris(tetrachloro-1,2-benzenediolato)phosphate(V)] (TRISPHAT); fluoroantimonates, such as hexafluoroantimonate; fluorophosphates, such as hexafluorophosphate; fluoroborates, such as tetrafluoroborate ($BF_4^-$); and derivatives thereof.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2A shows a molecular structure of a polymethine cation ($Cy^+$), wherein the blue atoms are nitrogen and the green atom is chlorine;

FIG. 2B shows molecular structures of counterions according to the present technology: (1) $I^-$, (2) $PF_6^-$, (3) $SbF_6^-$, (4) Δ-TRISPHAT (TRIS), and (5) Tetrakis(pentafluorophenyl)borate (TPFB);

FIG. 2C is an illustration of an exemplary structure of a transparent or opaque solar cell;

FIG. 16A shows structures of heptamethine salt cations (1 (1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium) and 2 (1-Butyl-2-(2-[3-[2-(1-butyl-1H-benzo[cd]indol-2-ylidene)-ethylidene]-2-phenyl-cyclopent-1-enyl]-vinyl)-benzo[cd]indolium) and anions ($BF_4^-$ and tetraphenylfluoroborate, $TPFB^-$);

FIG. 16B is a graph showing normalized thin film absorption (1−Transmission) of salts provided by the structures shown in FIG. 14A;

FIG. 16C is a summary of high-resolution mass spectrometry m/z spectra for cations and anions shown in FIG. 16A, wherein multiple peaks and their relative heights represent the isotopic abundances of the compound's constituent elements;

FIG. 17A is a graphic illustration of a device architecture used for photovoltaic and photodetector structures;

FIG. 17B is a current density-voltage (J-V) graph;

FIG. 17C shows external quantum efficiency (EQE) curves for devices with salts with thicknesses of 12 nm (inset highlights NIR EQE);

Figure 19A:
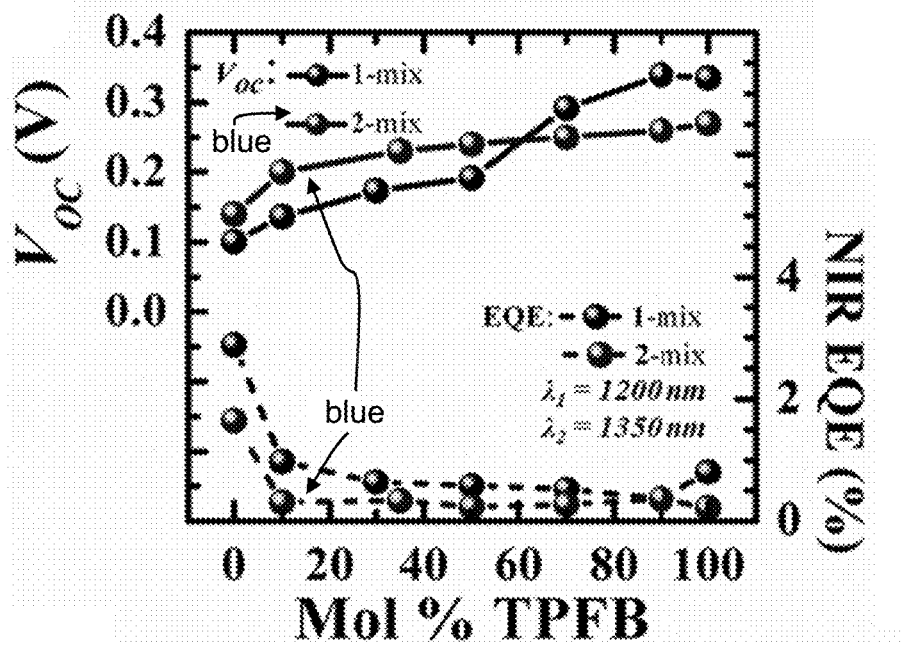
FIG. 19A is a graph showing $V_{OC}$ (left axis) and EQE (right axis) as functions of mole fraction TPFB for blends of (black) 1-BF$_4$ and 1-TPFB and (blue) 2-B F$_4$ and 2-TPFB at $t_D$=6 nm.
Figure 19B:
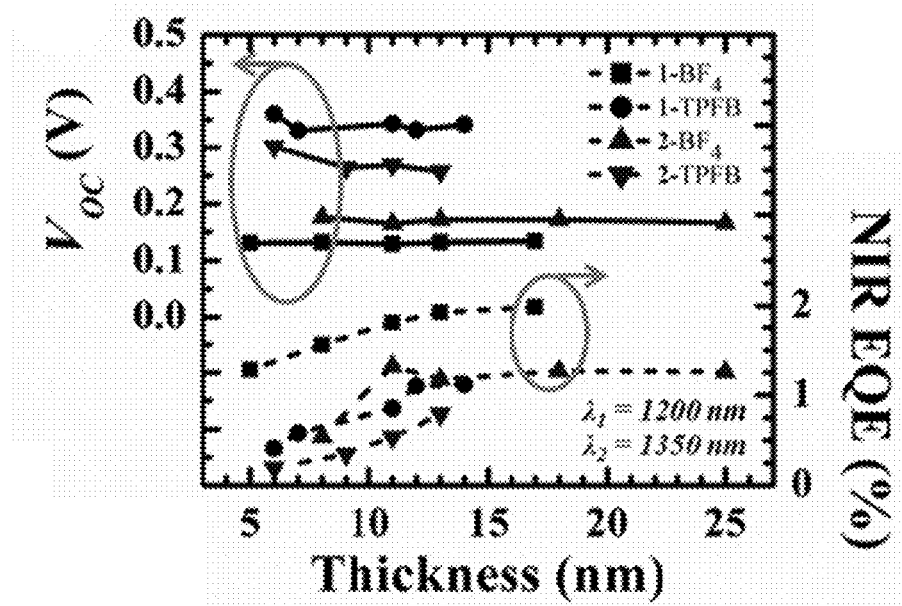
Figure 20:
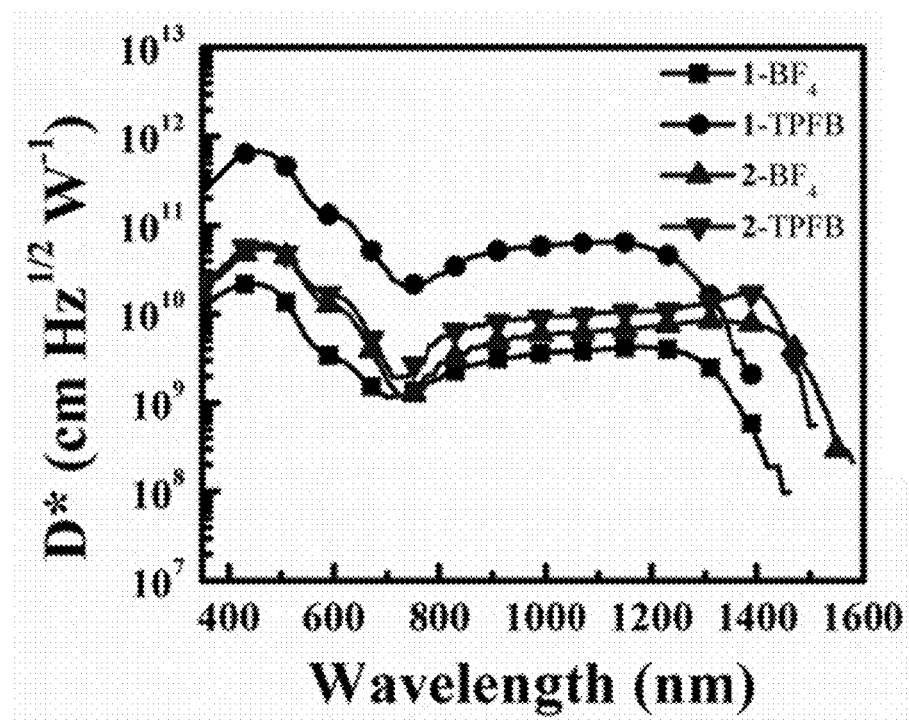

FIG. 19B is a graph showing a wavelength of EQE shown in inset: 1200 nm for 1-BF$_4$ and 1-TPFB and 1350 nm for 2-BF$_4$ and 2-TPFB; and FIG. 20 shows specific detectivity D* spectra for each salt donor.

Corresponding reference numerals indicate corresponding parts throughout the several views of the drawings.

DETAILED DESCRIPTION

Example embodiments will now be described more fully with reference to the accompanying drawings.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters.

As referred to herein, ranges are, unless specified otherwise, inclusive of endpoints and include disclosure of all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The current technology provides apparatuses and methods directed to photo-active devices and light harvesting systems, such as photovoltaics and photodetectors. The photo-active devices and light harvesting systems can be opaque, transparent, heterojunction cells, or multi-junction cells. The devices and systems include organic salts that selectively or predominately harvest light with wavelengths in the infrared (IR) region of the solar spectrum, near IR (NIR) region of the solar spectrum, or both the IR and NIR regions of the solar spectrum.

Figure 1A:
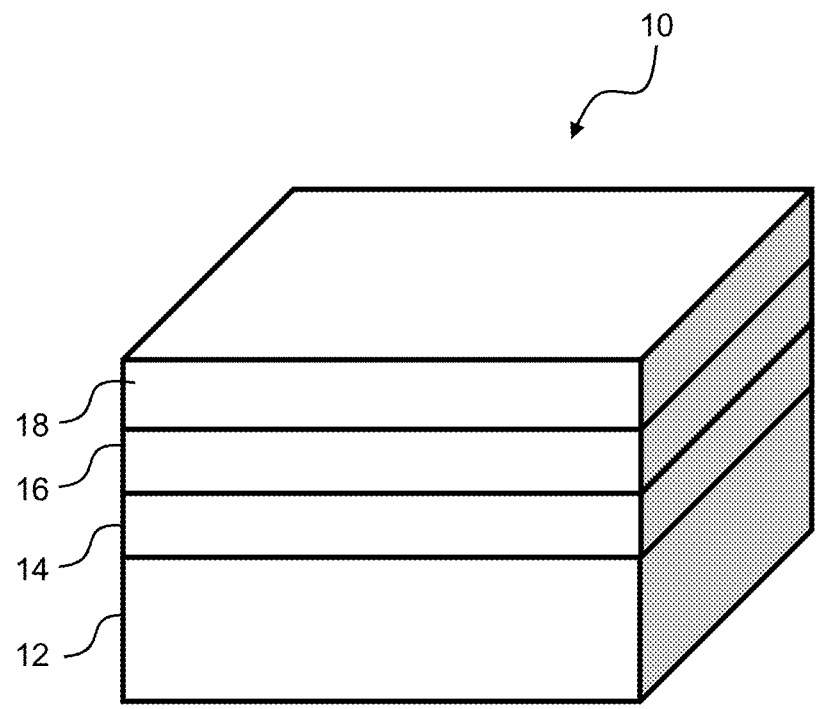
FIG. 1A is a schematic illustration of a first device according to the present technology.
Figure 13:
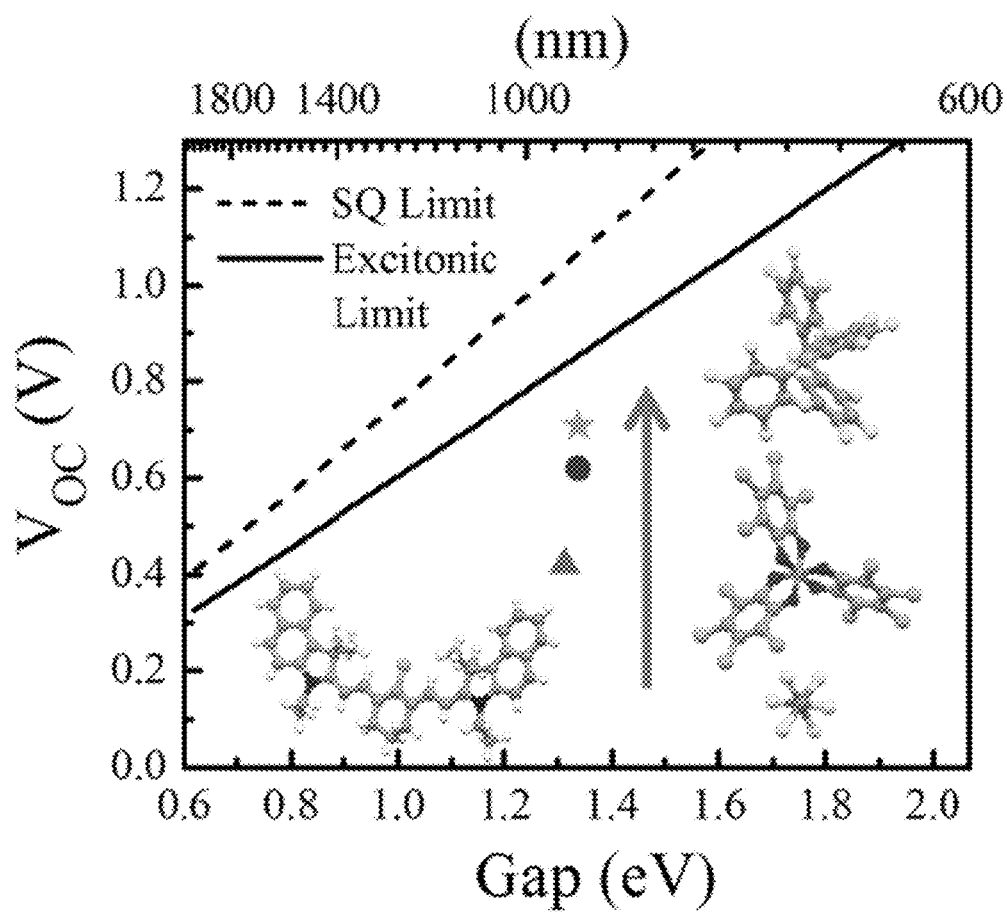
FIG. 13 is a graph showing VOCs versus excitonic bandgap.
Figure 14A:
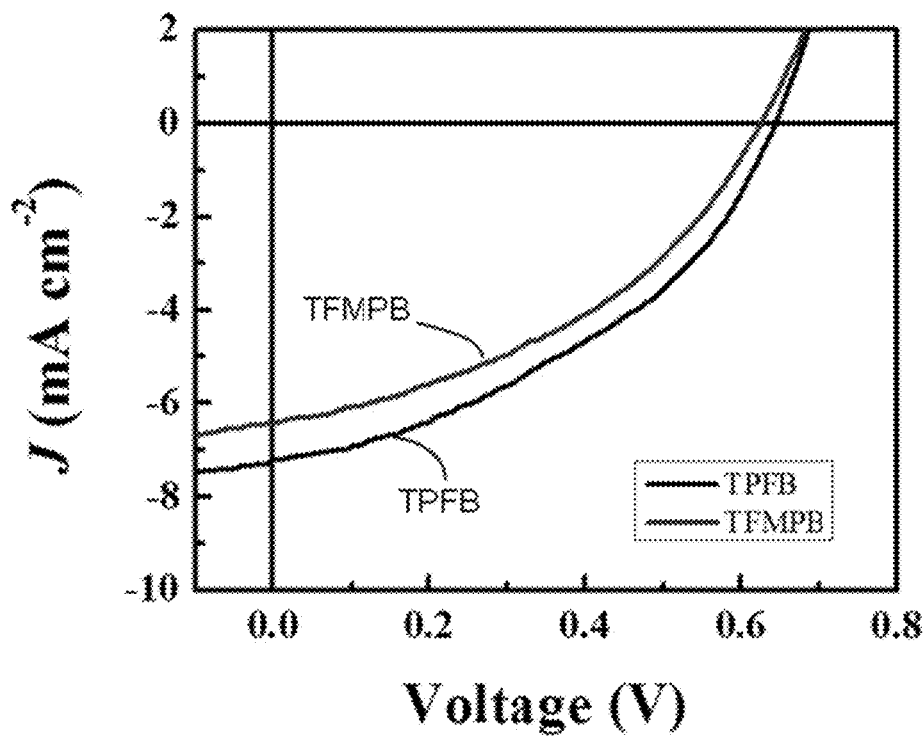
FIG. 14A is a graph showing J-V data for a device with 2-[2-[2-chloro-3-[2-(1,3-dihydro-3,3-dimethyl-1-ethyl-2H-benz[e]indol-2-ylidene)ethylidene]-1-cylohexen-1-yl]-ethenyl]-3,3-dimethyl-1-ethyl-1H-benz[e]indolium (Cy) tetrakis (pentafluorophenyl)borate (TPFB) and Cy tetrakis[3,5-bis (trifluoromethyl)phenyl]borate (TFMPB)
Figure 14B:
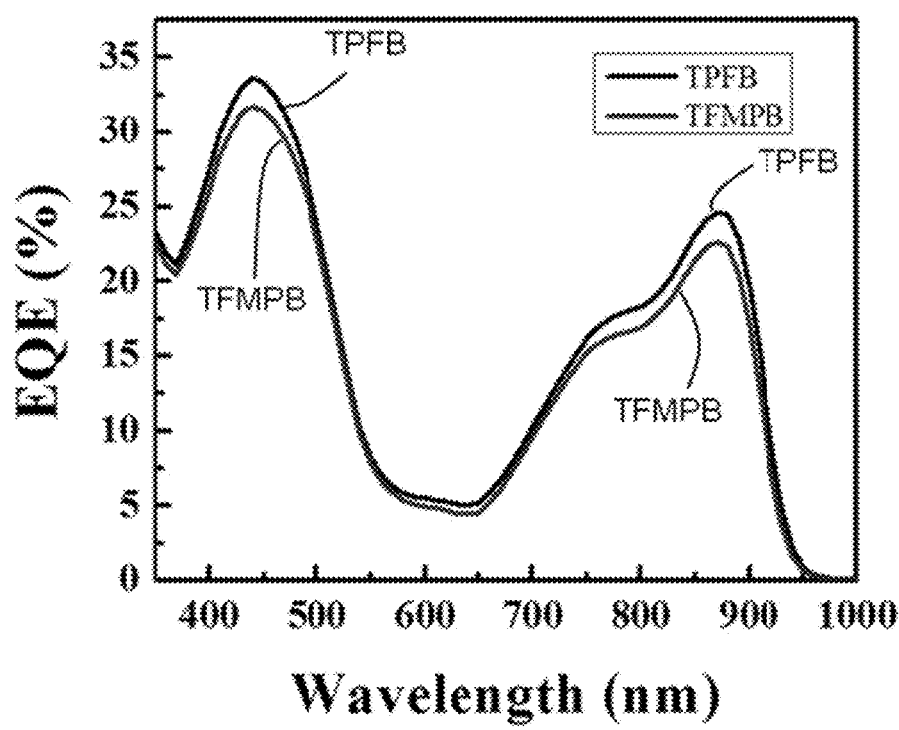
FIG. 14B is a graph showing EQE data for a device with CyTPFB and CyTFMPB.

With reference to FIG. 1A, the present technology provides a photo-active device 10. The photo-active device 10 comprises a substrate 12, a first electrode 14, an active layer 16 comprising an organic salt and optionally a complimentary electron donor or electron acceptor, and a second electrode 18. In embodiments where the active layer 16 does not include a complimentary electron donor or electron acceptor, the complimentary electron donor or electron acceptor may be provided in a separate distinct layer (not shown). In various embodiments, the photo-active device 10 includes at least one, or a plurality of, active layers 16, at least one, or a plurality of, complimentary layers that include electron donors or electron acceptors, or at least one of, or a plurality of, both active layers 16 and complimentary layers. The active layer 16 and any complimentary layers have a thickness of from about 1 nm to about 300 nm, or from about 3 nm to about 100 nm. Although not shown, in some embodiments the photo-active device 10 also includes buffer layers positioned between any of the layers and electrodes 12, 14, 16, 18, which may block excitons, modify a work function or collection barrier, induce ordering or templating, or serve as optical spacers. The photo-active device 10 has an open circuit voltage that is within about 30% or about 20% of the excitonic limit as defined in Lunt et al., "Practical Roadmap and Limits to Nanostructured Photovoltaics" (Perspective) Adv. Mat. 23, 5712-5727, 2011, which is incorporated herein by reference. Briefly, the form for the excitonic limiting open circuit voltage, i.e., the excitonic limit, under 1 Sun follows roughly 80% of the theoretical Shockley-Queisser thermodynamically limited open circuit voltage (See FIG. 13) that is limited by the smallest of the band gaps. The factor of 80% in the excitonic limit accounts for the minimum energetic driving force required to dissociate excitons. Alternatively, the photo-active device 10 has an open circuit voltage that is within about 50% or about 35% of the thermodynamic limit.

The substrate 12 of the photo-active device 10 can be any visibly transparent or visibly opaque material 12 known in the art. Non-limiting examples of transparent substrates include glass, low iron glass, plastic, poly(methyl methacrylate) (PMMA), poly-(ethylmethacrylate) (PEMA), (poly)-butyl methacrylate-co-methyl methacrylate (PBMMA), polyethylene terephthalate (PET), and polyimides, such as Kapton® polyimide films (DuPont, Wilmington, Del.). Non-limiting examples of opaque substrates include amorphous silicon, crystalline silicon, halide perovskites, stainless steel, metals, metal foils, and gallium arsenide.

The substrate 12 comprises the first electrode 14. As shown in FIG. 1A, the first electrode 14 is positioned or deposited on a first surface of the substrate 12 as, for example, a thin film, by solution deposition, drop casting, spin-coating, doctor blading, vacuum deposition, plasma sputtering, or e-beam deposition, as non-limiting examples, with thicknesses that allow for active-layer films that are visibly transparent or visibly opaque. However, in various embodiments, multiple electrodes 14 may be present, such as with a device having a first electrode on a first surface of a substrate and on a second opposing surface of the substrate (not shown). In another embodiment, depicted as FIG. 1B, a photo-active device 10' has the same components as the photo-active device 10 of FIG. 1A (a substrate 12, an electrode 14, and an active layer 16, and optionally buffer layers); however, the first electrode 14 is positioned within the substrate 12. Therefore, the substrate 12 may include materials that act as the electrode 14, such that the substrate 12 and electrode 14 are visibly indistinguishable. In any embodiment, the first electrode 14 can be composed of any material known in the art. Non-limiting examples of electrode materials include indium tin oxide (ITO), aluminum doped zinc oxide (AZO), indium zinc oxide, zinc oxide, and gallium zinc oxide (GZO), ultra-thin metals, such as Ag, Au, and Al, graphene, graphene oxide, poly(3,4-ethylenedioxythiophene) polystyrene sulfonate (PEDOT:PSS), and combinations thereof. In various embodiments, the first electrode 14 has a thickness of from about 1 nm to about 500 nm, from about 1 nm to about 200 nm, from about 10 nm to about 200 nm, from about 15 nm to about 150 nm, or from about 500 nm or less. Notwithstanding, it is understood that changing the thickness of the first electrode 14 may alter the visible transparency of the photo-active device 10 via modulation of complex interference associated with the multiple layers 12, 14, 16 in the photo-active device 10.

The active layer 16 is positioned or disposed on a surface of the electrode 14 in the photo-active device 10, such as by solution deposition, drop casting, spin-coating, doctor blading, or vacuum deposition, as non-limiting examples, with thicknesses that allow for films that are visibly transparent or visibly opaque. Therefore, the photo-active device 10 includes the first electrode 14, which has a first surface in contact with the substrate 12 and a second surface in direct contact with active layer 16. However, in some embodiments, a buffer layer is positioned between the substrate 12 and the first electrode 14 and/or a buffer layer is positioned between the first electrode 14 and the active layer 16. Also, the second electrode 18 may be in direct contact with the active layer 16 or a buffer layer may be positioned between the second electrode 18 and the active layer 16. In some embodiments, such as with the photo-active device 10' of FIG. 1B, the first electrode 14 is positioned within the substrate 12. In such embodiments, the active layer 16 is positioned on, and as in direct contact with, a first surface of the substrate 12.

Figure 9A:
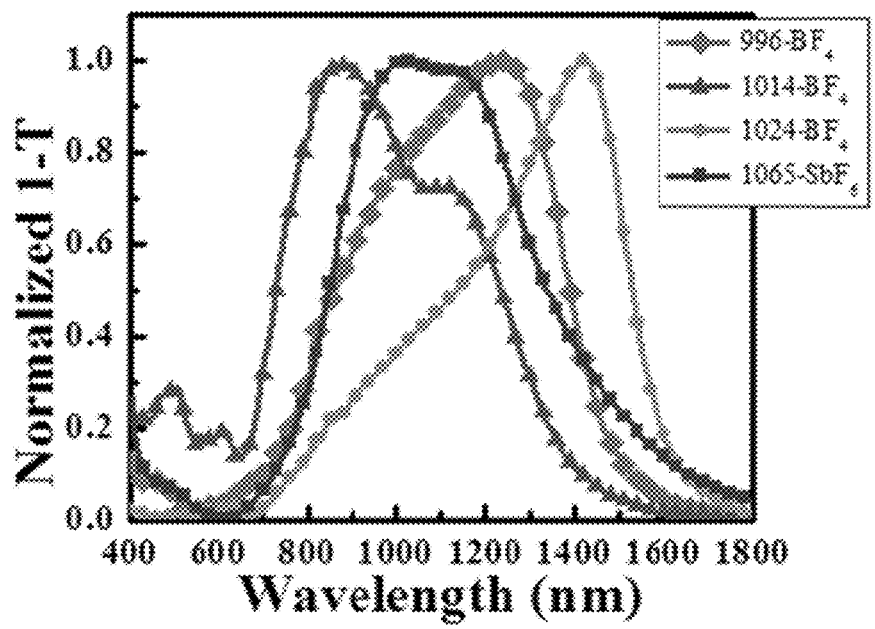
FIG. 9A is a graph showing normalized transmission spectra for four organic salt films with optical activity deeper in the near infrared (NIR)
Figure 9B:
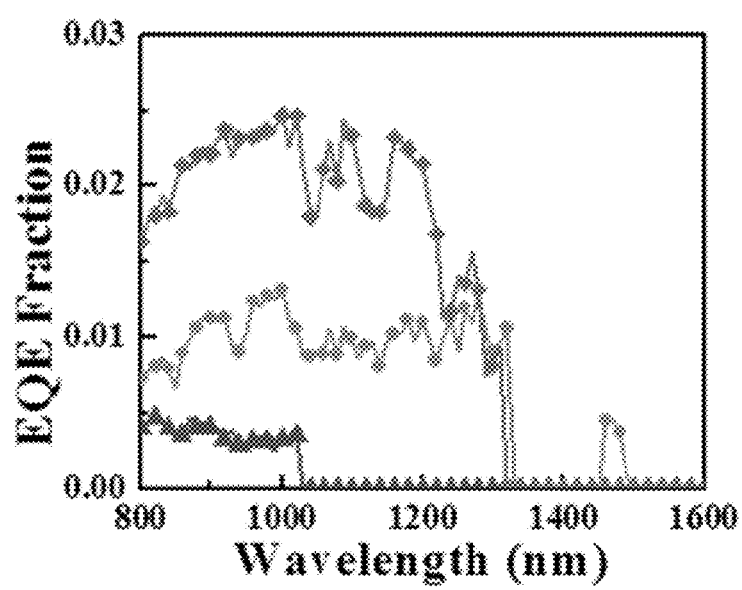
FIG. 9B is a graph of EQE spectra for each of the deeper NIR active organic salts in devices from FIG. 9A.
Figure 10:
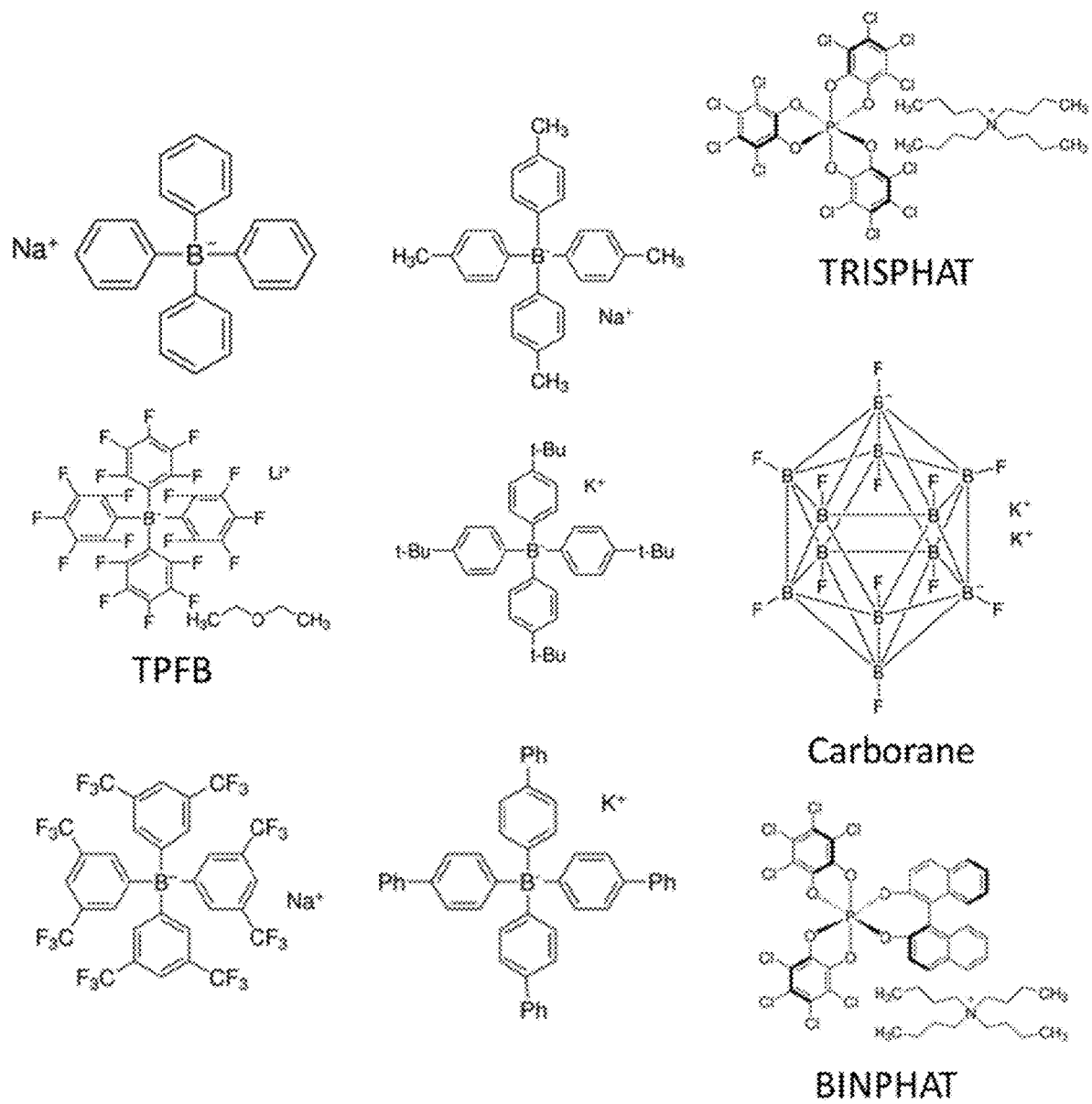
FIG. 10 shows molecular structures of additional exemplary anions that have been identified as suitable counterion pairings to achieve high voltages with NIR organic salts.
Figure 11:
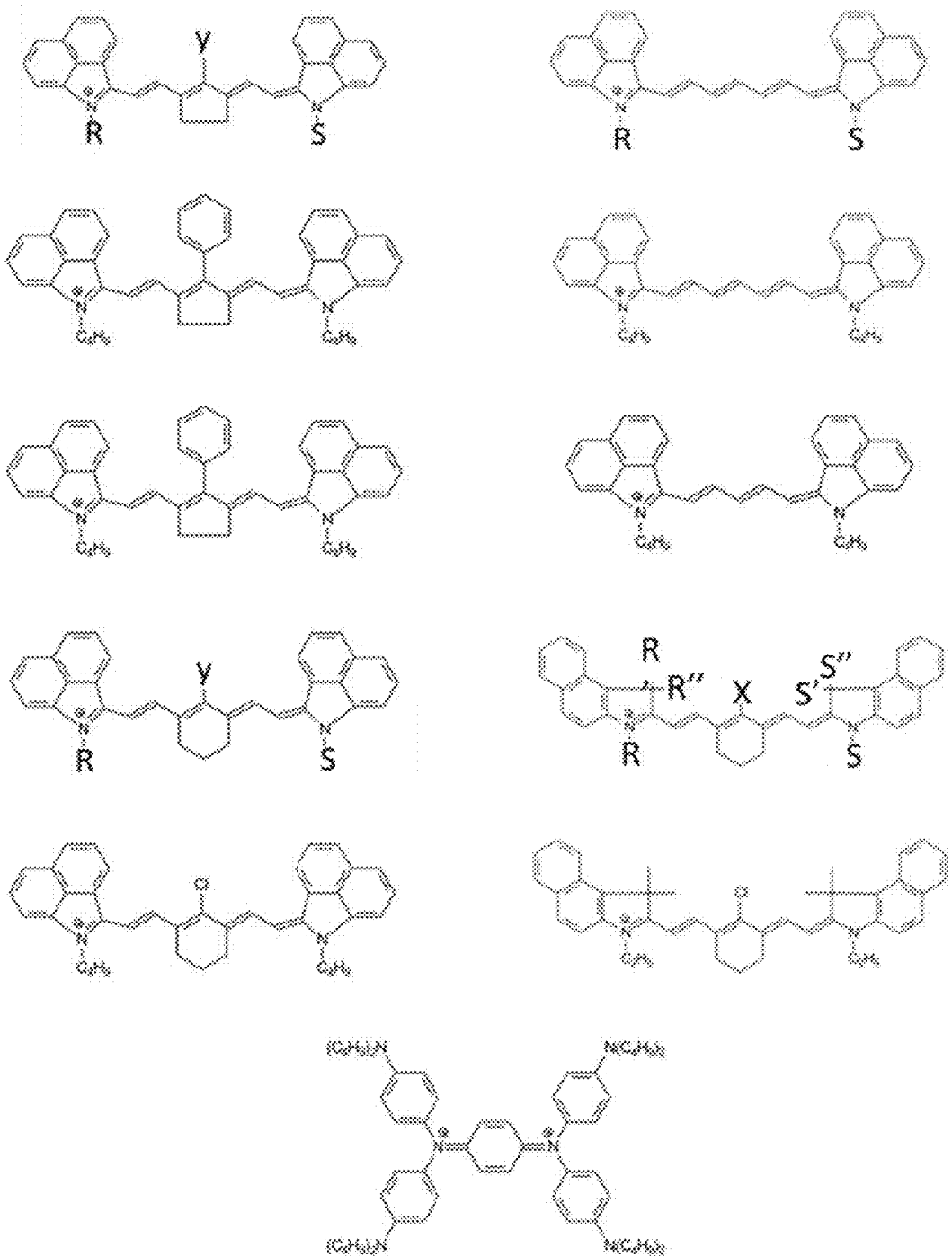
FIG. 11 shows a range of exemplary selectively harvesting NIR organic cations that have been identified as suitable for devices and transparent cells.

As mentioned above, the active layer 16 comprises an organic salt and a complimentary electron donor or electron acceptor. The photoactive organic salt can, as non-limiting examples, be comprised of any combination of cations shown in FIG. 10 and anions shown in FIG. 11 with selected absorption profiles shown, for example, in FIGS. 9A and 9B. However, it is understood that any combination of cation or anion described herein can be used in the photo-active device 10. In various embodiments, the organic salts act as electron donors and are paired with electron acceptors, such as $C_{60}$ in the active layers 16. In other embodiments, the organic salts act as electron acceptors and are paired with electron donors or other organic molecules or salts. Here, the organic salts harvest light with wavelengths in the NIR, or IR regions of the solar spectrum, or both the NIR and IR regions. As used herein, "VIS" light has a wavelength from about 400 nm to about 675 nm, "NIR" light has a wavelength from about 675 nm to about 1500 nm and "IR" light has a wavelength form about 1500 nm to about 1 mm. Also, as used herein the terms "transparent" or "visibly transparent" refer to devices that have an average visible transparency, weighted by the photopic response of an eye, of about 50% or more for specular transmission. The terms "opaque" or "visibly opaque" refer to devices that have an average visible transparency, weighted by the photopic response of an eye of 10% or less for specular transmission. Devices that have an average visible transparency, weighted by the photopic response of an eye of between 10% to 50% for specular transmission are "semitransparent." As a person of ordinary skill in the art appreciates, organic salts include a cation and a counterion, i.e., an anion. In various embodiments, the organic salt is a polymethine salt or cyanine salt that selectively or predominately harvests NIR and/or IR light, such as the exemplary structures shown in FIG. 11. Non-limiting examples of suitable organic cations (which are "base cations" relative to their derivatives) that form organic salts in the presence of a counterion include 1-Butyl-2-(2-[3-[2-(1-butyl-1H-benzo[cd]indol-2-ylidene)-ethylidene]-2-phenyl-cyclopent-1-enyl]-vinyl)-benzo[cd]indolium (peak absorbance at 1024 nm), 1-Butyl-2-(2-[3-[2-(1-butyl-1H-benzo[cd]indol-2-ylidene)-ethylidene]-2-chloro-cyclohex-1-enyl]-vinyl)-benzo[cd]indolium (peak absorbance at 1014 nm), 1-Butyl-2-(2-[3-[2-(1-butyl-1H-benzo[cd]indol-2-ylidene)-ethylidene]-2-phenyl-cyclohex-1-enyl]-vinyl)-benzo[cd]indolium (peak absorbance at 997 nm), 1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium (peak absorbance at 996 nm), 1-Butyl-2-[7-(1-butyl-1H-benzo[cd]indol-2-ylidene)-hepta-1,3,5-trienyl]-benzo[cd]indolium (peak absorbance at 973 nm), 2-[2-[2-chloro-3-[2-(1,3-dihydro-3,3-dimethyl-1-ethyl-2H-benz[e]indol-2-ylidene)ethylidene]-1-cylohexen-1-yl]-ethenyl]-3,3-dimethyl-1-ethyl-1H-benz[e]indolium ("Cy$^+$"; peak absorbance at 820 nm), N,N,N',N'-Tetrakis-(p-di-n-butylaminophenyl)-p-benzochinon-bis-immonium (peak absorbance at 1065 nm), 4-[2-[2-Chloro-3-[(2,6-diphenyl-4H-thiopyran-4-ylidene)ethylidene]-1-cyclohexen-1-yl]ethenyl]-2,6-diphenylthiopyrylium, 1-Butyl-2-[2-[3-[(1-butyl-6-chlorobenz[cd]indol-2(1H)-ylidene)ethylidene]-2-chloro-5-methyl-1-cyclohexen-1-yl]ethenyl]-6-chlorobenz[cd]indolium, 1-Butyl-2-[2-[3-[(1-butyl-6-chlorobenz[cd]indol-2(1H)-ylidene)ethylidene]-2-chloro-1-cyclohexen-1-yl]ethenyl]-6-chlorobenz[cd]indolium, Dimethyl{4-[1,7,7-tris(4-dimethylaminophenyl)-2,4,6-heptatrienylidene]-2,5-cyclohexadien-1-ylidene}ammonium, 5,5'-Dichloro-11-diphenylamino-3,3'-diethyl-10,12-ethylenethiatricarbocyanine, 2-[2-[2-Chloro-3-[2-(1,3-dihydro-1,1,3-trim ethyl-2H-benzo[e]-indol-2-ylidene)-ethylidene]-1-cyclohexen-1-yl]-ethenyl]-1,1,3-trimethyl-1H-benzo[e]indolium, 2-[2-[2-Chloro-3-[2-(1,3-dihydro-1,3,3-trimethyl-2H-indol-2-ylidene)-ethylidene]-1-cyclopenten-1-yl]-ethenyl]-1,3,3-trimethyl-3H-indolium, 2-[2-[3-[(1,3-Dihydro-3,3-dimethyl-1-propyl-2H-indol-2-ylidene)ethylidene]-2-(phenylthio)-1-cyclohexen-1-yl]ethenyl]-3,3-dimethyl-1-propylindolium, 1,1',3,3,3',3'-4,4',5,5'-di-benzo-2,2'-indotricarbocyanine perchlorate, 2-[2-[2-Chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium, 3,3'-Diethylthiatricarbocyanine, 2-[[2-[2-[4-(dimethylamino)phenyl]ethenyl]-6-methyl-4H-pyran-4-ylidene]methyl]-3-ethyl, 2-[7-(1,3-Dihydro-1,3,3-trimethyl-2H-indol-2-ylidene)-1,3,5-heptatrienyl]-1,3,3-trimethyl-3H-indolium, derivatives thereof, and combinations thereof. As used herein, "derivatives" of the organic cations refer to or include organic cations that resemble a base organic cation, but that contain minor changes, variations, or substitutions, such as in, for example, solubilizing groups (e.g., R, R', R", S, S', S" in FIG. 11) with varying alkyl chain length or substitution with other solubilizing groups, which do not substantially change the bandgap or electronic properties as shown in FIG. 10 as well as substitutions at a central methane position (X,Y) with various halides or ligands. Non-limiting examples of counterions (which are "base counterions" relative to their derivatives) or anions that form salts with the organic cations include halides, such as F$^-$, Cl$^-$, I$^-$, and Br$^-$; aryl borates, such as tetraphenylborate, tetra(p-tolyl)borate, tetrakis(4-biphenylyl)borate, tetrakis(1-imidazolyl)borate, tetrakis(2-thienyl)borate, tetrakis(4-chlorophenyl)borate, tetrakis(4-fluorophenyl)borate, tetrakis(4-tert-butylphenyl)borate, tetrakis(pentafluorophenyl)borate (TPFB), tetrakis[3,5-bis(trifluoromethyl)phenyl]borate (TFMPB), [4-[bis(2,4,6-trimethylphenyl)phosphino]-2,3,5,6-tetrafluorophenyl]hydrobis(2,3,4,5,6-pentafluorophenyl)borate, [4-di-tert-butylphosphino-2,3,5,6-tetrafluorophenyl]hydrobis(2,3,4,5,6-pentafluorophenyl)borate; carboranes, (∧,R)-(1,1'-binaphthalene-2,2'diolato)(bis(tetrachlor-1,2-benzenediolato)phosphate(V)) (BINPHAT), [Δ-tris(tetrachloro-1,2-benzenediolato)phosphate(V)] (TRISPHAT); fluoroantimonates, such as hexafluoroantimonate (SbF$_6^-$); fluorophosphates, such as hexafluorophosphate (PF$_6^-$); fluoroborates, such as tetrafluoroborate (BF$_4^-$); derivatives thereof; and combinations thereof. As used herein, "derivatives" of the counterion refer to or include counterions or anions that resemble a base counterion, but that contains minor changes, variations, or substitutions, that do not substantially change the ability of the counterion to form a salt with the organic cations.

As shown in FIG. 1A, the second electrode 18 is positioned or deposited on a surface of the active layer 16 as, for example, a thin film. The second electrode 18, is positioned or deposited on the surface of the active layer 16 by, solution deposition, drop casting, spin-coating, doctor blading, vacuum deposition, plasma sputtering, or e-beam deposition, as non-limiting examples, with thicknesses that allow for active-layer films that are visibly transparent or visibly opaque. Therefore, the second electrode 18 is in contact with a surface of the active layer 16 that opposes a surface of the active layer that is in contact with the first electrode 14. The second electrode 18 can be composed of any material known in the art. Non-limiting examples of electrode materials include indium tin oxide (ITO), aluminum doped zinc oxide (AZO), zinc oxide, and gallium zinc oxide (GZO), ultra-thin metals, such as Ag, Au, and Al, graphene, graphene oxide, poly(3,4-ethylenedioxythiophene) polystyrene sulfonate (PEDOT:PSS), and combinations thereof. In various embodiments, the second electrode 18 has a thickness of from about 1 nm to about 500 nm, from about 1 nm to about 200 nm, from about 10 nm to about 200 nm, from about 15 nm to about 150 nm, or from about 500 nm or less. Notwithstanding it is understood that changing the thickness of the second electrode 18 may alter the visible transparency of the photo-active device via modulation of complex optical interference and absorption associated with the multiple layers 12, 14, 16 in the photo-active device 10.

With further regard to the first electrode 14 and the second electrode 18, at least one of the electrodes 14, 18 is visibly transparent in embodiments where the device is visibly opaque. In embodiments where the device is visibly transparent, both the first electrode 14 and the second electrode 18 are visibly transparent with thicknesses tailored to optimize the visible transparency in the active layer 16.

Figure 1B:
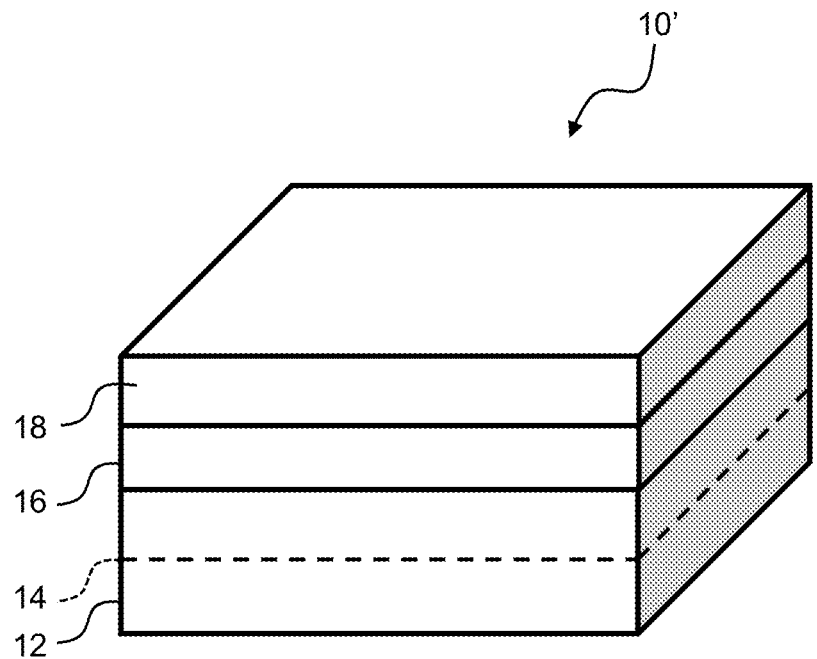
FIG. 1B is a schematic illustration of a second device according to the present technology.

Although not shown in FIG. 1A or 1B, in various embodiments the photo-active devices 10, 10' further include additional active layers, such as electron donors and/or electron acceptors, electrode layers, or combinations thereof. For example, additional active layers may include molybdenum oxide (MoO$_3$), bathocuproine (BCP), C$_{60}$, or ITO. Additional electrodes may be composed of layers of Ag, Au, Pt, Al, or Cu. Additional non-limiting examples of electron acceptors include of C$_{70}$, C$_{84}$, [6,6]-phenyl-C61-butyric acid methyl ester, TiO$_2$, metal oxides, perovskites, other organic salts, organic molecules, or polymers. Active layers can be composed of neat planar layers of donor-acceptor pairs, mixed layers of blended donor-acceptor pairs, or graded layers of blended donor-acceptor pairs. In various embodiments, the photo-active device 10, 10' is integrated into a multijunction device architecture as a subcell, wherein the multijunction device is either visibly transparent or visibly opaque. As described above, the photo-active device can be a photovoltaic or a photodetector.

Figure 12A:
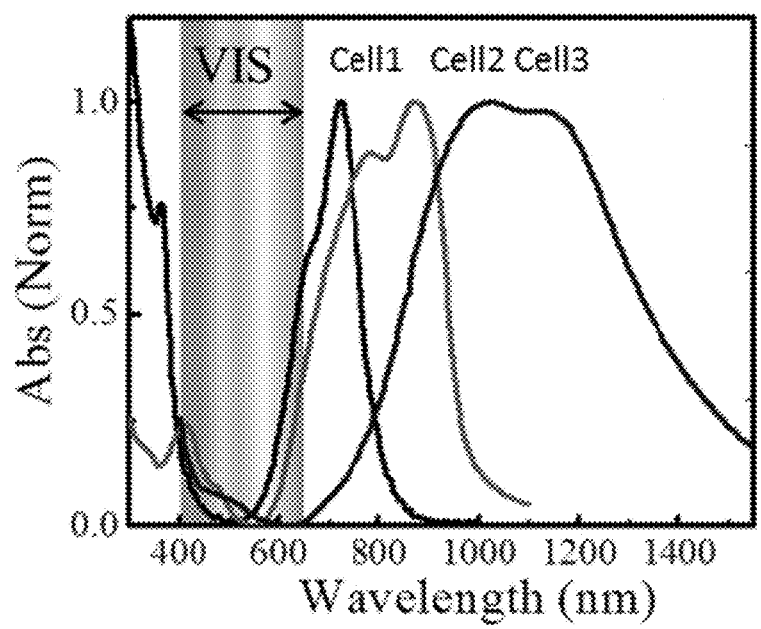
FIG. 12A shows absorption spectra for three cells with complimentary absorption for multijunction incorporation.
Figure 12B:
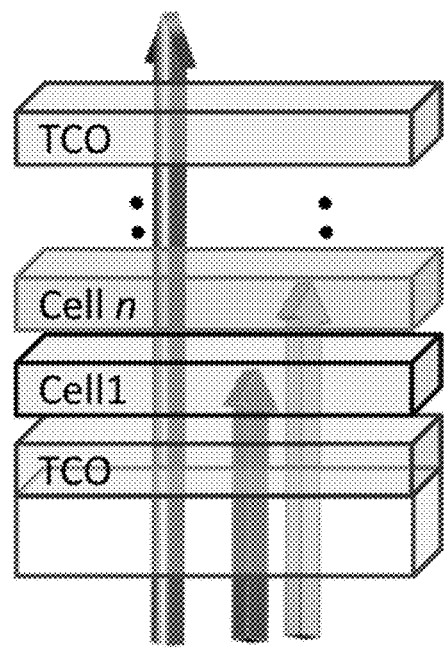
FIG. 12B is a schematic illustration of multijunction opaque or transparent cells with complimentary NIR absorbers in each sub-cell for enhanced performance and efficiency.

Organic salts with deeper selective harvesting in the near-infrared with a range of selective-near-infrared peaks from about 700 nm to about 1600 nm (FIG. 12A) further enable development of efficient and low-cost multijunction devices, both opaque and transparent, with complimentary response across the solar spectrum (FIG. 12B). These organic salts also enable precise tuning of frontier orbital levels and heterojunction interface gaps through anion alloying, i.e., blending two or more anions together, that result in voltages near the thermodynamic limit (FIG. 13) that can provide an independent tuning parameter to optimize the product of photocurrent and photovoltage.

Accordingly, the present technology also provides a method for adjusting a frontier energy level, or highest occupied molecular orbital (HOMO), position of a material in a photo-active device. The method includes blending two or more organic salts together, wherein the organic salts have the same cations, but different anions. Blending the organic salts together generates an anion alloy, i.e., a composition comprising a homogeneous cation and a plurality of anions. For example, an anion alloy generated from two different organic salts having a common cation is a two-anion one-cation mixture. The anion alloy may be in the form of a thin film. The method also comprises disposing the anion alloy between a first electrode and a second electrode. One of the first electrode or the second electrode is positioned directly or indirectly on a substrate. The anions and cations can be any anions and cations described herein. The different organic salts blended together may be blended together in equimolar amounts or in non-equimolar amounts. By adjusting energy level positions, custom photo-active devices may be manufactured. In various embodiments, the method also includes disposing additional layers to the photo-active device as discussed above.

Embodiments of the present technology are further illustrated through the following non-limiting examples.

Example 1

Experimental

Materials and Synthesis: 2-[2-[2-chloro-3-[2-(1,3-dihydro-3,3-dimethyl-1-ethyl-2H-benz[e]indol-2-ylidene)ethylidene]-1-cylohexen-1-yl]-ethenyl]-3,3-dimethyl-1-ethyl-1H-benz[e]indolium iodide (CyI) was purchased from the American Dye Source (Quebec, Canada) and was filtered through a plug of silica with a 5:1 DCM:MeOH solvent mixture before use. Lithium tetrakis(pentafluorophenyl)borate ethyl etherate, $NaPF_6$ (98%), and $AgSbF_6$ (98%) were purchased from Sigma Aldrich (St. Louis, Mo.) and used as received. Δ-TRISPHAT tetrabutylammonium salt (98.5%) was purchased from Santa Cruz Biotechnology (Dallas, Tex.), $C_{60}$ (99.9%) was purchased from MER (Materials and Electrochemical Research Corp, Tucson, Ariz.), bathocuproine (BCP) was purchased from Luminescence Technology Corp. (Hsin Chu, Taiwan), and $MoO_3$ (99.9995%) was purchased from Alfa Aesar (Ward Hill, Mass.). All exchanges followed procedures known in the art, except for $CySbF_6$, which was exchanged via a precipitation reaction with $AgSbF_6$ in dichloromethane (DCM). Filtering all exchange products through a plug of silica with DCM as an eluent allowed for the more polar remnant CyI to be easily removed.

Device Fabrication and Testing:

Glass substrates pre-patterned with 1200 Å of ITO were cleaned by sequential sonication in soap, deionized water, and acetone for four minutes each, followed by boiling in isopropanol for five minutes and oxygen plasma treatment for five minutes. All devices were fabricated with an active area of 4.9 mm². Compounds (1)-(4) of FIGS. 2A and 2B were spin-coated for 5 s at 600 rpm followed by 20 s at 2000 rpm from chlorobenzene solutions of varying concentrations. Compound (5) of FIGS. 2A and 2B was dissolved in a 3:1 CB:DCM solution due to limited solubility in CB. All other layers were deposited at 1 Å/s via vacuum thermal evaporation with a pressure below $3 \cdot 10^{-6}$ torr. The device structure for opaque devices was: $MoO_3$ (100 Å)/CyX (x Å)/$C_{60}$ (400 Å)/BCP (75 Å)/Ag (800 Å). The device structure for transparent devices was: $MoO_3$ (100 Å)/CyX (x Å)/$C_{60}$ (400 Å)/BCP (75 Å)/Ag (20 Å)/$MoO_3$ (1000 Å)/ITO (1000 Å) as shown in FIG. 2C. Film thicknesses and optical constants were determined using ellipsometry. Current density (J) was measured as a function of voltage (V) under dark conditions and AM1.5G solar simulation (xenon arc lamp) where the intensity was measured using a NREL-calibrated Si reference cell with KG5 filter. J-V characteristics were averaged over at least 24 devices fabricated in three independent device sets. External quantum efficiency (EQE) measurements were calibrated using a Newport calibrated Si detector.

Optical Characterization:

Specular transmittance of films and device stacks were measured using a dual-beam Lambda 800 UV/VIS spectrometer in the transmission mode without the use of a reference sample.

Optical Modeling:

Exciton diffusion lengths were fit from EQE data using transfer matrix optical modeling. This modeling was also used to identify optical layer thickness structures for both opaque and transparent devices.

Results and Discussion

The synthesis, characterization, and photovoltaic device performance of a series of organic salts with response past 800 nm and up to 1600 nm was realized. A key core NIR active heptamethine cations ($Cy^+$) was used as an exemplary organic salt to explore the impact of varying counterion substitutions (See FIGS. 2A and 2B). To improve the accuracy of comparisons between counterions, each salt was prepared by a single-step solution-based counterion exchange from a single batch of CyI. These counterions were chosen to illustrate the effects of counterion size, electronegativity, and molecular structure on solid state photophysical properties and device performance.

Figure 3A:
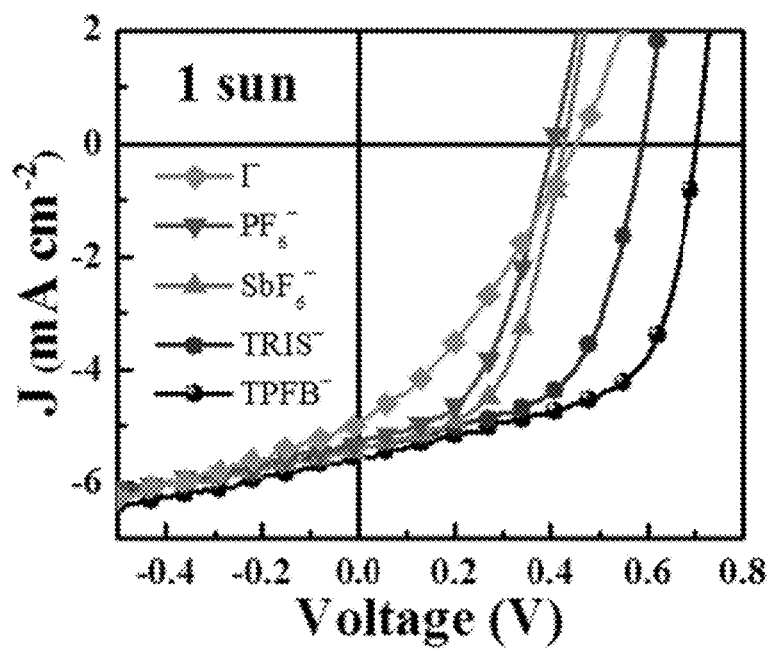
FIG. 3A shows a J-V curve for representative devices for each counterion shown in FIG. 1B under 1 sun illumination, wherein an optimized opaque device structure for each counterion was ITO (120 nm)/MoO3 (10 nm)/CyX (8-12 nm)/C60 (40 nm)/BCP (7.5 nm)/Ag (100 nm)
Figure 3B:
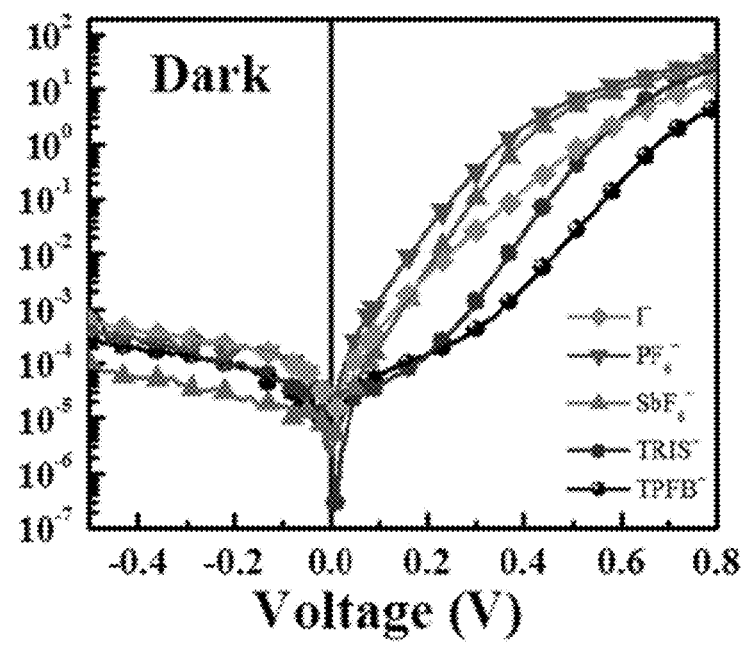
FIG. 3B shows a J-V curve for representative devices for each counterion shown in FIG. 1B under dark conditions, wherein an optimized opaque device structure for each counterion was ITO (120 nm)/MoO3 (10 nm)/CyX (8-12 nm)/C60 (40 nm)/BCP (7.5 nm)/Ag (100 nm)

FIG. 3A shows J-V characteristics of the most representative devices for each counterion under one sun illumination and FIG. 3B shows J-V characteristics in dark conditions. It is immediately apparent that the counterion plays a dramatic role in J-V performance. CyI and $CyBF_4$ show low fill factors (0.3-0.4), whereas $CyPF_6$, $CySbF_6$, CyTRIS, and CyTPFB show fill factors as high as 0.64. $BF_4^-$ and $I^-$ are also the smallest, most mobile counterions. Table 1 provides J-v characteristics for each counterion.

TABLE 1

| | J-v characteristics for each counterion | | | |
|---|---|---|---|---|
| Device | $J_{SC}$ [mA cm$^{-2}$] | $V_{OC}$ [V] | FF [—] | PCE [%] |
| Transparent TPFB | 2.6 | 0.69 | 0.53 | 0.95 |
| Opaque TPFB | 5.57 | 0.71 | 0.60 | 2.34 |
| Δ-TRISPHAT | 5.06 | 0.63 | 0.62 | 1.97 |
| $SbF_6^-$ | 4.85 | 0.45 | 0.64 | 1.40 |
| $PF_6^-$ | 4.73 | 0.41 | 0.63 | 1.24 |
| $I^-$ | 4.79 | 0.45 | 0.32 | 0.70 |

Figure 4A:
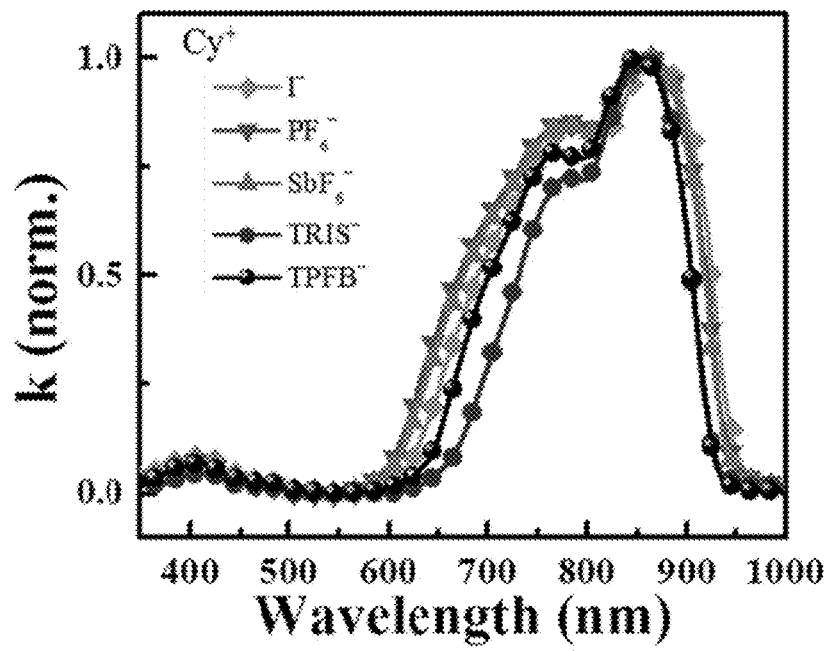
FIG. 4A is a graph showing normalized extinction coefficients of various $Cy^+$ salts
Figure 4B:
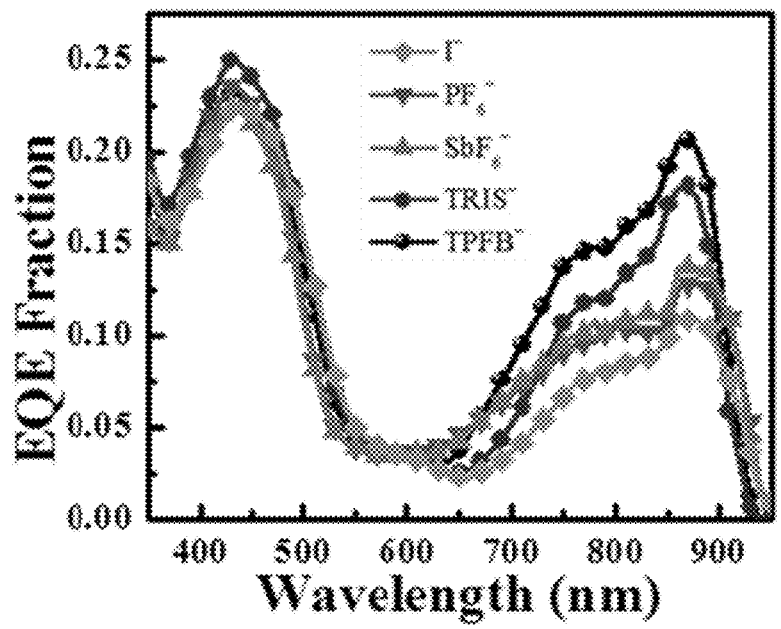
FIG. 4B is a graph showing external quantum efficiency of partially optimized devices structures for each $Cy^+$ salt shown in FIG. 4A.
Figure 5A:
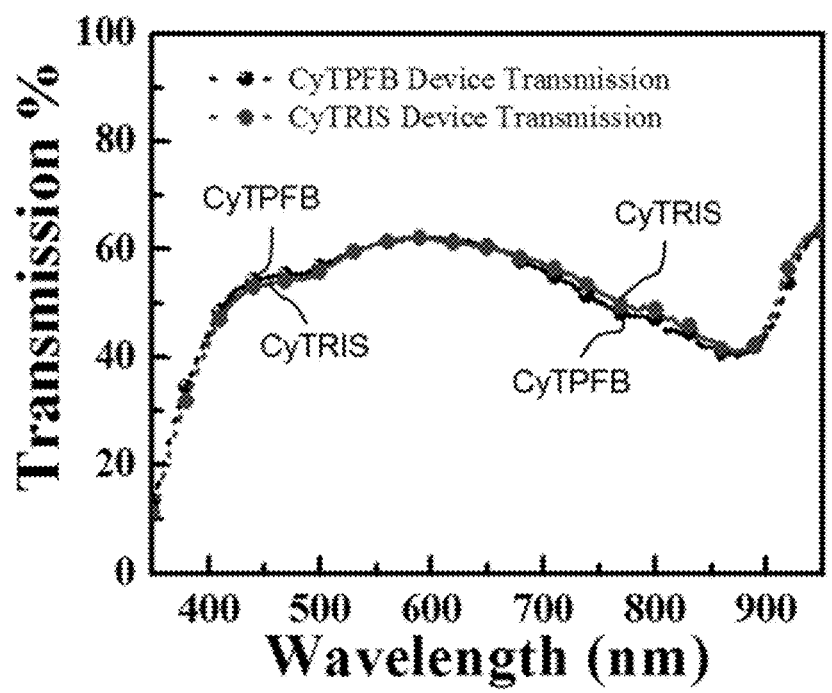
FIG. 5A shows transmission scans of full transparent devices for Cy(4) and Cy(5) of FIGS. 2A and 2B.
Figure 5B:
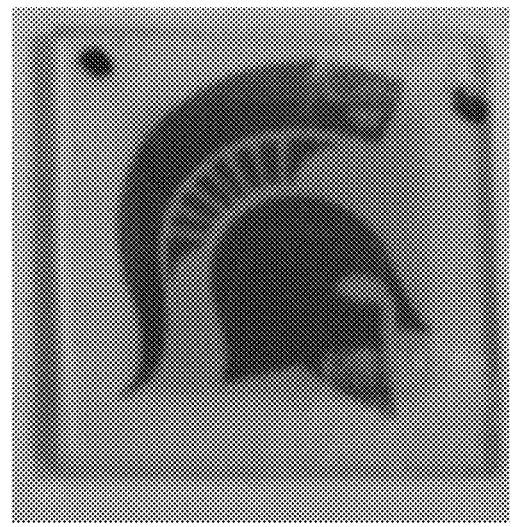
FIG. 5B is a photograph of a transparent solar cell device according to the present technology placed over a Michigan State University Spartan helmet logo.
Figure 15A:
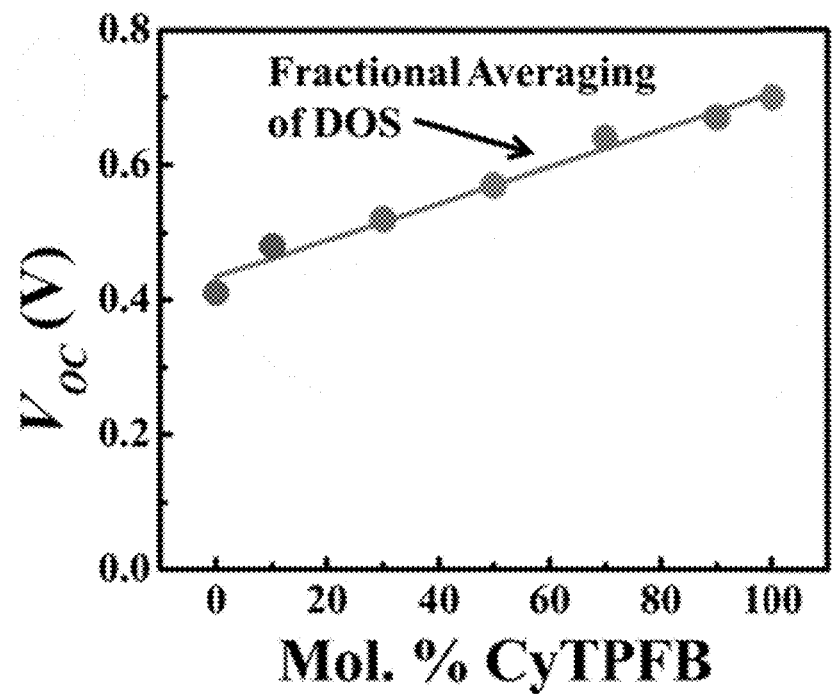
FIG. 15A is a graph showing $V_{OC}$ as a function of mole percent CyTPFB in blends with $CyPF_6$.
Figure 15B:
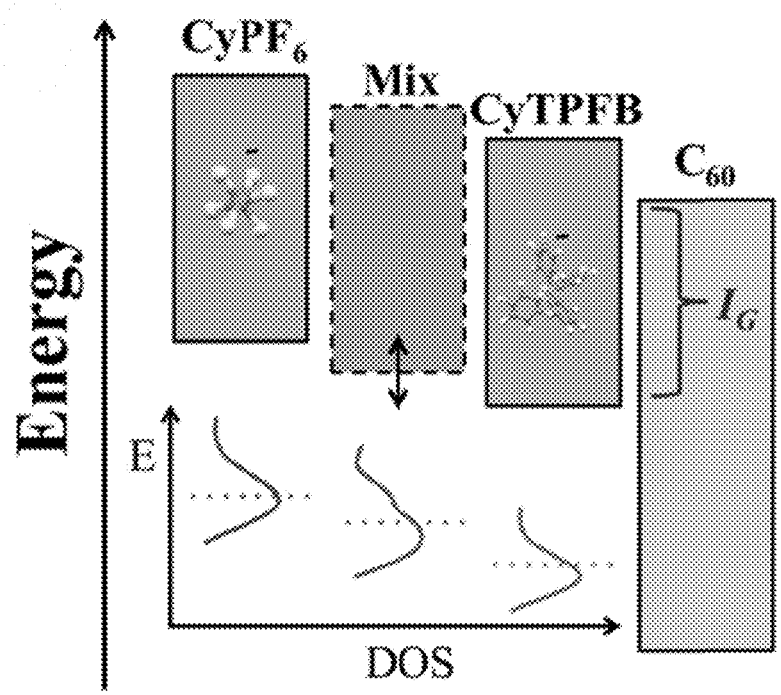
FIG. 15B is a schematic representation of an enhanced energy level alignment between CyTPFB and $C_{60}$, as well as the tunability of an interface gap via mixtures of $CyPF_6$ and CyTPFB, wherein the inset illustrates the mechanism of density of states (DOS) averaging for shifts in frontier energy levels and enhanced $V_{OC}$.

Normalized extinction coefficients of each salt are shown in FIG. 4A and external quantum efficiencies (EQEs) of the devices are shown in FIG. 4B. Transmission scans of transparent devices are shown in FIG. 5A and FIG. 5B shows a transparent device placed over a Michigan State University Spartan helmet logo to demonstrate transparency. Device data for CyTFMPB is shown in FIGS. 15A and 15B.

Figure 6A:
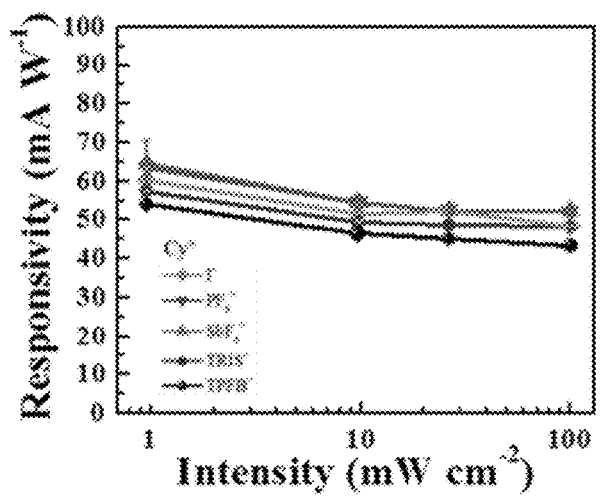
FIG. 6A is a graph of responsivity versus intensity for each Cy+ salt shown in FIG. 6D, wherein responsivities are comparable across a range of counterions.
Figure 6B:
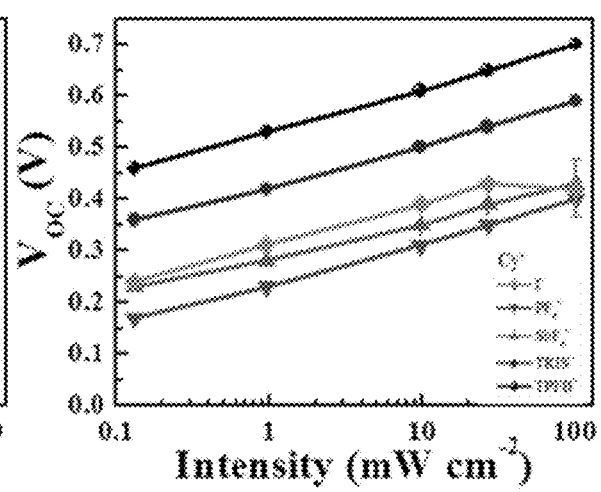
FIG. 6B is a graph of open-circuit voltages (VOCs) versus intensity for each Cy+ salt shown in FIG. 6D, wherein the VOCs for each salt is dramatically different.
Figure 6C:
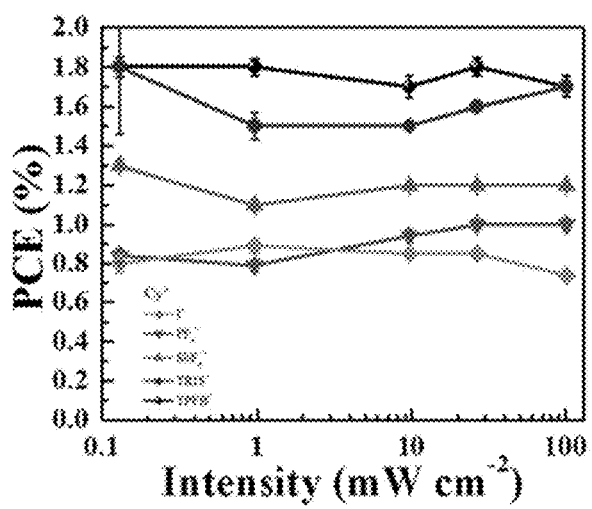
FIG. 6C is a graph of power conversion efficiency (PCE) versus intensity for each $Cy^+$ salt shown in FIG. 6D.
Figure 6D:
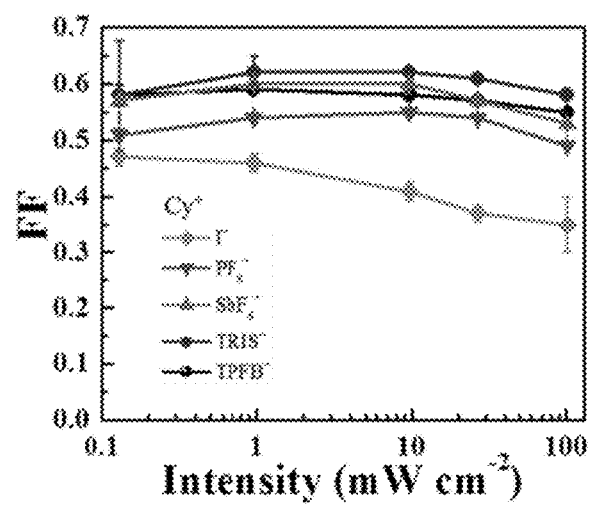
FIG. 6D is a graph of fill factor (FF) versus intensity for each $Cy^+$ salt, wherein the FF is considerably lower for Cyl, but recovered at low intensities.
Figure 7A:
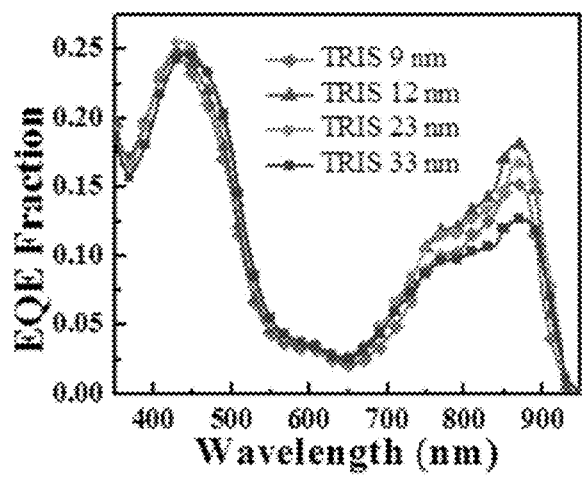
FIG. 7A is a graph showing thickness dependence of external quantum efficiency (EQE) for CyTRIS.
Figure 7B:
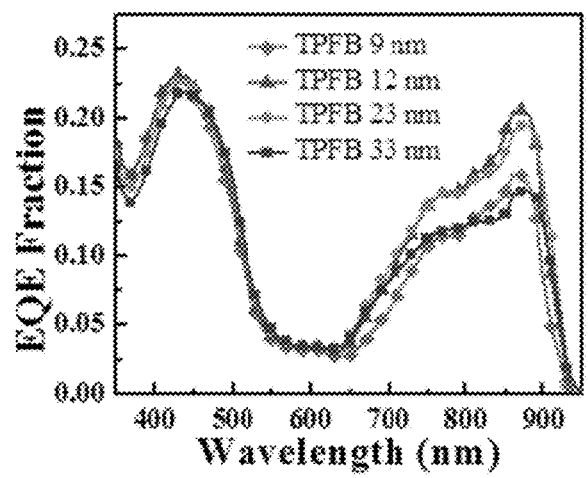
FIG. 7B is a graph showing thickness dependence of EQE for CyTPFB.
Figure 7C:
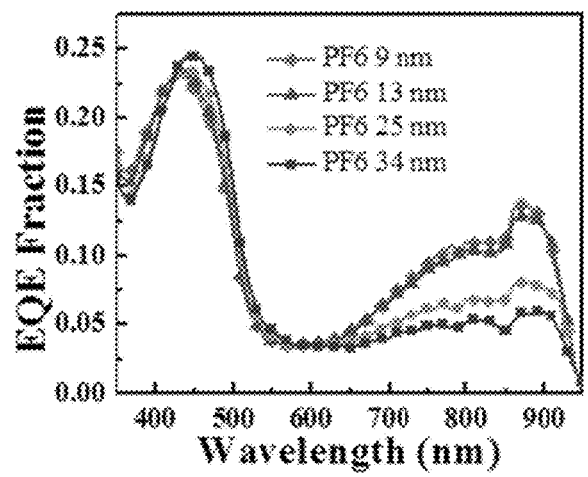
FIG. 7C is a graph showing thickness dependence of EQE for $CyPF_6$.
Figure 7D:
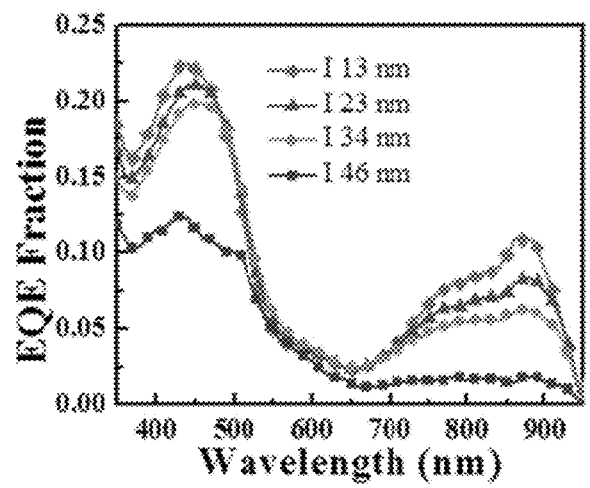
FIG. 7D is a graph showing thickness dependence of EQE for CyI.

Intensity dependent J-V parameters for each counterion are shown in FIGS. 6A-6D. As shown in FIG. 6B, $CySbF_6$ showed minimal Voc enhancement of ~0.03 V over $CyPF_6$, with a comparable Voc as CyI. However, much more substantial Voc increases were observed with the Δ-TRISPHAT and TPFB anions (0.2 V and 0.3 V greater than the Voc of CyPF$_6$, respectively).

The most interesting feature observed in the dark curves is in the forward bias. Counterions showing a higher Voc show a corresponding increase in ideality factor. Despite the dramatic increase in Voc for CyTPFB devices, there is no appreciable decrease in the reverse saturation dark current, Js. Voc enhancements are commonly understood by a reduced leakage current, but this mechanism does not appear to be significant in this case.

Figure 8:
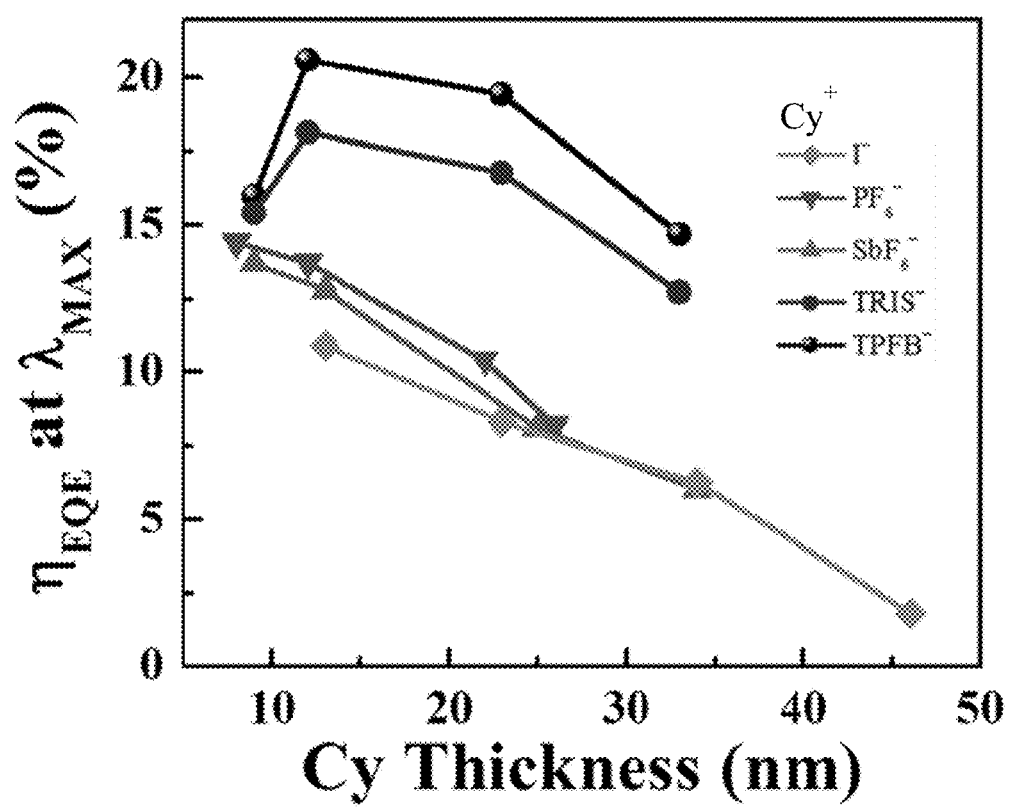
FIG. 8 is a graph showing thickness dependence of peak EQE in the NIR for $Cy^+$ with various counterions, wherein $Cy^+TRIS^-$ and $Cy^+TPFB^-$ peak at a slightly higher thickness and higher efficiency than the other counterions.

To characterize exciton diffusion length, EQE was measured as a function of thickness for each counterion. The results are provided in FIGS. 7A-7D. CyTPFB and CyTRIS show significantly less EQE roll-off with increasing thickness, confirming an enhancement in exciton diffusion length, charge collection length, or both. This trend can also be seen in FIG. 8, where the peak EQE is plotted as a function of thickness for each anion and follows the trend of fitted $L_D$ enhancement. In reality, the charge collection efficiency, $\eta_{CC}$, could diminish at larger thicknesses, thus suggesting that the diffusion lengths are likely lower estimates.

To investigate whether mobile ion shunting and the development of a space charge region was significant in these devices, we performed poling experiments by biasing the devices under −1 V for 30 min. Voc and FF did not increase appreciably in CyPF$_6$ or CyTPFB devices.

When studying single crystals it has been found that TPFB shows a higher symmetry environment surrounding the cation in single crystals. However, the films incorporated into the current devices have shown no crystallinity and are completely amorphous.

FIG. 4A shows the normalized extinction coefficients for each counterion as measured by ellipsometry. CyTPFB and CyTRIS show slightly narrower absorption widths compared to the other counterions, with absorption ranges of approximately 650-930 nm and 670-930 nm, respectively, compared to 620-950 nm for CyI, CyPF$_6$ and CySbF$_6$. This effect can likely be attributed to a combination of the increased separation (and corresponding reduced aggregation and interaction) between Cy cations and the decreased polarization of the Cy cation seen in crystalline solids of these salts. Both of these effects would result in a decreased distribution of available states for absorption. While the narrowing of the peaks does correspond to a slight decrease in the optical gap of ~0.03 eV, this is clearly insufficient to explain a 0.3 V increase in Voc.

Peak narrowing has the advantage of increasing average visible transmittance and color rendering index for transparent photovoltaic applications. The long wavelength cut-off of photopic response is at ~675 nm, and as can be seen in FIG. 4A, the CyTPFB and CyTRIS have considerably less overlap with the photopic response curve than the other anions, Cy(1)-(4). Narrowing could also have the benefit of decreasing competitive absorption with ClAlPc or other NIR donors in multijunction transparent photovoltaics for enhanced performance.

This work presents molecular design strategies that enable facile tuning of energy level alignment and open-circuit voltages in organic salt-based photovoltaics via anion alloying or blending. With increasing CyTPFB content in a CyPF$_6$-CyTPFB mixture, a steady linear increase in Voc (see FIGS. 15A and 15B) and a significant decline in $J_0$, is observed, which follows the expected behavior for interface gap modulation and HOMO level shifts. Similar linear behavior for mixing with CySbF$_6$ and CyTRIS, as well as with other cation/anion combinations are also observed.

Thus, this identifies the key mechanism responsible for the voltage enhancement and is the first clear evidence in support of an energy level alignment explanation in such systems. This mechanism provides a powerful new tuning parameter for optimizing the highest occupied molecular orbital (HOMO) position to balance charge generation via charge transfer efficiency with interface recombination dynamics.

Conclusion

Open circuit voltage enhancement from 0.40 V to 0.72 V via counterion exchange in organic photovoltaics with photocurrent generation past 800 nm and up to 1600 nm has been demonstrated. Relative to the optical excitonic gap of this molecule, this is the highest reported $V_{OC}$ for a cyanine-based photovoltaic, nearing the excitonic limit. This increase to the elimination of mid-gap defect states and ion mobility is attributed to the steric hindrance of the aromatic counterions. Moreover, these new molecules show exceptional potential for transparent photovoltaics through selective near-infrared harvesting. This work demonstrates how to achieve high voltage near-infrared absorbing organic photovoltaics and highly efficient transparent photovoltaics.

Example 2

Introduction

Few organic photovoltaics (OPVs) and organic photodetectors (OPDs) have demonstrated a photoresponse past 900 nm, a previously under-utilized spectral region for tandem solar cells, transparent solar cells and infrared photodetectors. Here, heptamethine salts with selective deep near-infrared (NIR) photoresponses are demonstrated with external quantum efficiencies (EQEs) cutoffs at λ=1400 nm or 1600 nm. Anion exchange is shown to deepen frontier orbital levels with minimal changes in absorption properties, leading to decreases in dark current, increases in open-circuit voltage (approaching excitonic limits), and increases in specific detectivity. Balancing exciton binding energy and charge transfer efficiency is shown to be key for enhancing the performance of very small bandgap NIR-absorbing devices. These organic salts represent a pathway to inexpensive infrared solar cells and detectors, expanding the catalog of existing donor materials for transparent and multijunction solar cells.

Organic semiconductors that absorb in the NIR, i.e., at λ>800 nm, are promising for applications in broadband and transparent solar cells. Organic compounds with NIR photovoltaic response have been demonstrated including cyanines, carbon nanotubes, and polymers. However, EQEs in these studies have only extended to 1100 nm for SnNcCl$_2$ and 1450 nm for carbon nanotubes. Design strategies for redshifting the IR absorption of organic molecules have included increasing the conjugation and modifying the ligand structures to affect aggregation, crystal structure, and intermolecular proximities. However, once molecules are designed and integrated into optoelectronic devices, their performance typically suffers from arbitrary energy level alignments, resulting in lower-than-ideal open-circuit voltages, low carrier mobilities and diffusion lengths, and limited absorbance past 1000 nm. A new series of heptamethine salts with highest occupied molecular orbital (HOMO) levels that can be tuned by varying the anion electronegativity are now provided. These organic salts are used in photovoltaic and photodetector cells to demonstrate photoresponse at deep NIR wavelengths and open-circuit voltages nearing their excitonic limit. Using optical modeling and open-circuit voltage tuning, limiting factors for performance and strategies for performance enhancement are identified.

Heptamethine salts 1 (1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium, $\lambda_{max}$=996 nm) and 2 (1-Butyl-2-(2-[3-[2-(1-butyl-1H-benzo[cd]indol-2-ylidene)-ethylidene]-2-phenyl-cyclopent-1-enyl]-vinyl)-benzo[cd]indolium, $\lambda_{max}$=1024 nm) coordinated with the counterions tetrafluoroborate ($BF_4^-$) and tetrakis(pentafluorophenyl)borate ($TPFB^-$) are shown in FIG. 16A. As shown in FIG. 16B, these molecules have absorption ranges that extend to 1400 nm and 1600 nm for cations 1 and 2 respectively. FIG. 16C shows a summary of the m/z synthesis verification for the cation and anion masses.

Experimental

Synthesis of 1-TPFB and 2-TPFB:

Equimolar amounts of potassium tetrakis(pentaflurophenyl)borate (K-TPFB) and either 1- or 2-$BF_4$ were dissolved in 5:1 methanol:dichloromethane (MeOH:DCM) at 10 mg/ml and stirred at room temperature under nitrogen for 1 hr prior to reaction. All chemicals were used as received (Boulder Scientific Company, Few), and solvents were HPLC grade (Sigma Aldrich). The solid product was collected using vacuum filtration and an MeOH wash, redissolved in minimal DCM (~10 mg/ml), and poured through a plug of silica using DCM as eluent to remove impurities and unreacted 1- or 2-$BF_4$. The first fraction with similar color to 1- or 2-$BF_4$ was collected, and excess DCM was removed in a rotary evaporator at 55° C. for 20 min at atmospheric pressure.

Verification of 1-TPFB and 2-TPFB and Ion Purity Assessment:

Verification of cations, anions, and product purity were performed using a Waters Xevo G2-XS QToF mass spectrometer coupled to a Waters Acquity ultra-high pressure LC system. Cations were analyzed in positive ion mode electrospray ionization (ESI), and anions were analyzed in negative ion mode ESI. Solutions were prepared in acetonitrile and directly injected for 2 minutes using an eluent of 50:50 water:acetonitrile. Mass spectra were acquired using a dynamic range extension over m/z 50 to 1,500, with mass resolution (M/ΔM, full width-half maximum) of approximately 20,000. Other parameters include capillary voltage of 2 kV, desolvation temperature of 350° C., source temperature of 100° C., cone gas ($N_2$) at 0 L $h^{-1}$, and desolvation gas ($N_2$) at 400 L $h^{-1}$. The m/z calculated for cation 1 $[C_{51}H_{48}N_3]^+$ is 702.3848, and the measured m/z is 702.3641. The m/z calculated for $TPFB^-$ anion $[C_{24}BF_{20}]^-$ is 678.9774, and the measured m/z is 678.9788. The m/z calculated for cation 2 $[C_{45}H_{43}N_2]^+$ is 611.3426, and the measured m/z is 611.3421. The m/z calculated for $TPFB^-$ anion $[C_{24}BF_{20}]^-$ is 678.9774, and the measured m/z is 678.9789.

For ion purity assessment, solutions of the exchange precursors and products were prepared in acetonitrile with concentrations varying from 10 nM to 500 nM and analyzed by mass spectrometry as described above. Calibration curves of integrated ion detection intensity for precursors K-TPFB, 1-$BF_4$ and 2-$BF_4$ vs. concentration were calculated to measure $BF_4^-$ and $TPFB^-$ ion concentrations in the exchange products 1-TPFB and 2-TPFB. The ion purity was measured to be >95% TPFB for both 1-TPFB and 2-TPFB.

Solar Cell Device Fabrication and Testing.

Patterned ITO substrates (Xin Yan, 100 nm, 20 Ω/sq) were sequentially cleaned in soap, DI water, acetone and boiling isopropanol for three minutes each. Substrates were then oxygen plasma treated for three minutes, and $MoO_3$ (99.9995%, Alfa Aesar) was thermally evaporated at 0.1 nm/s at $3×10^{-6}$ torr. Heptamethine salts were massed in air, dissolved in dimethyl formamide under a nitrogen environment, and sonicated for at least thirty minutes. Solutions were used without filtering and spincoated at 3000 rpm for 30 sec in a glovebox. Subsequent layers of $C_{60}$ (99.9%, MER Corp.), bathocuproine (BCP, Luminescience Technology, Inc.) and silver were thermally evaporated at 0.1, 0.05, and 0.2 nm/s, respectively. Layer thicknesses were measured using variable-angle spectroscopic ellipsometry (J. A. Woollam) on Si substrates. Device areas (average value: 5.7 mm²) were defined as the area of overlap between the anode and cathode and were measured using optical microscopy. Current density (J) was measured as a function of voltage using a Labview-controlled sourcemeter under xenon arc lamp illumination calibrated for AM1.5G (100 mW/mm²) intensity using a NREL-calibrated Si reference cell with KG5 filter. External quantum efficiency (EQE) measurements were performed by using monochromatic light from a tungsten halogen lamp chopped at 200 Hz, a picoammeter and a lock-in amplifier. The light intensity at the end of the IR-fiber was measured using a Newport calibrated Si diode for 350-800 nm and a Newport calibrated Ge diode for 800-1600 nm. Specific detectivity D* (cm $Hz^{1/2}$ $W^{-1}$) was calculated based on measurements at short circuit (V=0). D* is obtained from:

$$D^* = R\sqrt{A} S_N^{-1} \quad (1)$$

where R is responsivity in A/W, A is device area in cm², and $S_N^-$ is current spectral noise density in A $Hz^{-1/2}$. At room temperature and 0V, the noise is dominated by thermal (Johnson-Nyquist) noise $S_T$ (A $Hz^{-1/2}$), which is estimated as:

$$S_T = \sqrt{\frac{4k_B T}{R_D}} \quad (2)$$

where $k_B$ is the Boltzmann constant (J $K^{-1}$), T is temperature (K), and $R_D$ is the differential resistance of a solar cell in the dark at zero bias.

Ultraviolet photoelectron spectroscopy data were recorded with a He lamp emitting at 21.2 eV (He I radiation) on ~10 nm thick salt films on $MoO_3$/ITO. The samples were loaded without exposure to air. LUMO transport levels were estimated by adding the optical bandgaps (0.85 eV for 1-$BF_4$ and 1-TPFB and 0.80 eV for 2-$BF_4$ and 2-TPFB) and calculated exciton binding energies (0.55 eV for 1-$BF_4$ and 1-TPFB and 0.40 eV for 2-$BF_4$ and 2-TPFB) to the HOMO levels.

Results and Discussion

Figure 18A:
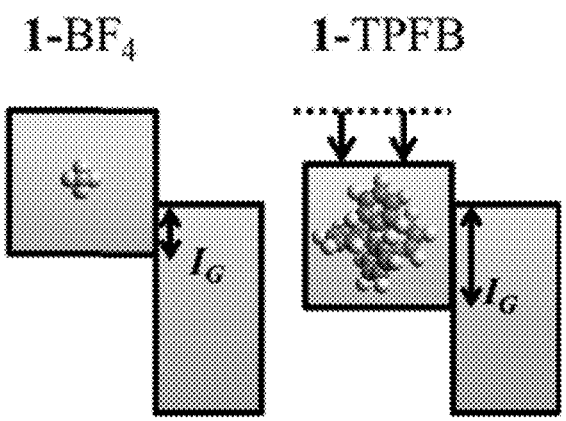
FIG. 18A is an energy schematic that illustrates the deepening of the lowest unoccupied molecular orbital (LUMO) level and increase in interface gap ($I_G$) after counterion exchange from a small anion $BF_4^-$ to a bulky and weakly-coordinating anion $TPFB^-$.

As shown in FIG. 17A, solar cell devices with the structure indium tin oxide (ITO)/10 nm $MoO_3$/t nm salt/40 nm $C_{60}$/7.5 nm bathocuproine (BCP)/80 nm Ag were prepared using the four salts as a function of thickness. Donor layers of each organic salt were spin-coated from N,N-dimethylformamide (DMF) under nitrogen while other layers were thermally deposited in vacuum. The thickness for each salt was controlled by varying the solution concentration. For comparison purposes, the J-V and EQE for devices with similar salt thicknesses (12±1 nm) are plotted in FIGS. 17B and 17C and average performance metrics are shown in Table 2. The exchange of $BF_4$ for TPFB nearly doubles the $V_{OC}$ from 0.13 to 0.33 V for cation 1 and 0.17 to 0.25 V for cation 2. This enhancement in the voltage is due to the shift in frontier energy levels and increased interface gap as shown in FIG. 18A. However, this exchange reduces the NIR EQE peak by more than 50% due to a substantial decrease in the donor-acceptor lowest unoccupied molecular orbital level offset ($\Delta_{LUMO}$). To understand the effect of gradual shifts in interface gap on EQE, alloyed blends of 1 or 2-BF$_4$ with varying molar ratios of 1- or 2-TPFB were prepared. The V$_{OC}$ and EQE trends as a function of TPFB molar fraction are plotted in FIG. 19A.

TABLE 2

Device Parameters and molecular properties for each salt.

| Salt | J$_{SC}$ (mA cm$^{-2}$) | V$_{OC}$ (V) | FF | Abs. Edge (nm) | NIR EQE Peak (%) | D* Peak (Jones) | J$_0$ (µA/cm$^2$) |
|---|---|---|---|---|---|---|---|
| 1-BF$_4$ | 3.4 ± 0.3 | 0.13 ± 0.01 | 0.34 ± 0.01 | 1440 | 2.1 | 3.7 × 10$^9$ | 48 |
| 1-TPFB | 1.9 ± 0.2 | 0.33 ± 0.01 | 0.49 ± 0.01 | 1440 | 1.1 | 5.3 × 10$^{10}$ | 0.014 |
| 2-BF$_4$ | 3.4 ± 0.3 | 0.33 ± 0.01 | 0.49 ± 0.01 | 1590 | 1.4 | 7.0 × 10$^9$ | 7.0 |
| 2-TPFB | 1.7 ± 0.2 | 0.25 ± 0.01 | 0.49 ± 0.01 | 1500 | 0.8 | 1.7 × 10$^{10}$ | 1.1 |

Figure 18B:
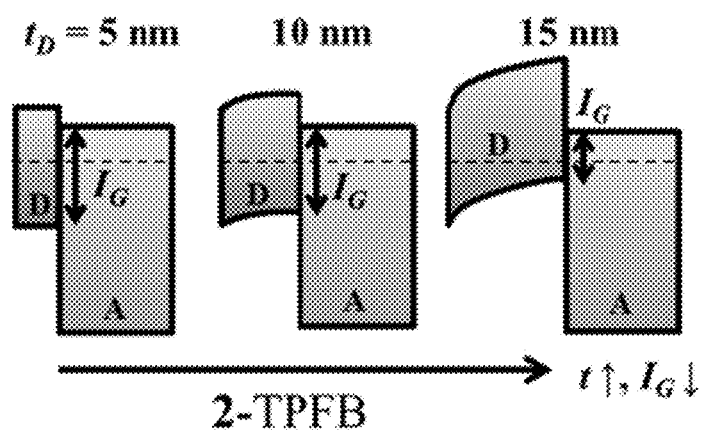
FIG. 18B is a schematic D-A band structure as a function of donor thickness ($t_D$)

The thickness trends of the pure salts are plotted in FIG. 19B, where V$_{OC}$ either remains flat (1-BF$_4$ and 2-BF$_4$) or decreases (1-TPFB and 2-TPFB) with increasing thickness and EQE monotonically increases. In general, the V$_{OC}$ is found to be independent of donor salt thickness in the 5-15 nm range. In some cases, open-circuit voltages for OPVs increase with thickness as parallel shunting pathways are eliminated by the formation of more complete films. In the case of 1- and 2-TPFB, however, V$_{OC}$ shows a modest decrease of 20% over the thickness range of 4 to 15 nm. Decreases in V$_{OC}$ with increasing thickness have been attributed to (1) increased recombination due to presence of disorder-induced gap tail states, (2) increased recombination due to electric field profile broadening and (3) shifts in the interface gap due to band bending (as shown in FIG. 18B). Mechanisms (1) and (2) are unlikely due to the small thickness range (1 nm) over which the voltage drop occurs; thus, the V$_{OC}$ decrease is most likely due to incomplete band bending in 1- and 2-TPFB devices as a function of thickness. In contrast, devices with 1- and 2-BF$_4$ have no thickness dependent photovoltage and therefore likely have smaller depletion widths stemming from either larger carrier densities or smaller dielectric constants.

Quantum efficiencies past 1000 nm have been limited in magnitude to <15% even for many quantum dot systems. To identify the limiting factors in the current NIR EQE, component efficiencies were examined. EQE can be expressed as the product of the internal efficiencies: η$_A$ (absorption), η$_{ED}$ (exciton diffusion), η$_{CT}$ (charge transfer), η$_{CD}$ (charge dissociation) and η$_{CC}$ (charge collection). Through exciton diffusion and optical interference modeling, EQE curves were well fit for effective exciton diffusion lengths, which were calculated assuming 100% charge transfer, charge dissociation, and charge collection efficiencies. From this analysis it was found that the effective diffusion lengths in these four salts are all from about 0.5 nm to about 1 nm due to the modest EQEs. However, it was also found that absorption profiles already reach 70% at the peak wavelength for 2-TPFB films that are only 25 nm thick, suggesting that these devices are not limited by absorption. With the extracted diffusion lengths, the optical interference model predicts that the EQE should decrease for all the tested salts with increasing thickness due to the inability of excitons to diffuse to the dissociating interface. This predicted trend of decreasing EQE is indeed seen experimentally in other larger gap cyanine salt devices. However, this behavior is in contrast to the experimental trends here, which show EQE monotonically increasing for donor layer thicknesses past 25 nm. This suggests that the intrinsic diffusion length is in fact longer than 0.5-1 nm and the EQE of these salts is instead limited by charge transfer, charge dissociation, or charge collection efficiency, at least one of which should not be modeled as 100%.

While there is not a clear method to directly distinguish between all of these component efficiencies (charge transfer, dissociation, and collection), insight about charge collection from other measurements can be inferred. For example, since the experimental C$_{60}$ EQE peak (λ=430 nm) does not decrease with increasing salt thickness and is similar in magnitude to other salt based OPVs with larger bandgaps, this implies that hole collection from excitons originating on C$_{60}$ (which still have to transport through the donor salt) is not a limiting factor. Thus, devices are most likely limited by charge transfer or dissociation efficiency as a result of the balance between the lowest unoccupied molecular orbitals of the donor and acceptor and the exciton binding energy.

To estimate the exciton binding energy, anion mixing experiments were performed and the emergence of sharp cutoffs in the EQE (FIG. 19A) were sought. Indeed, while there is a linear variation in the V$_{OC}$ that stems from a monotonic modulation of interface gap recombination, there is a sharp EQE cutoff at a molar fraction of 10% TPFB, suggesting that there is just enough energy (Δ$_{LUMO}$) available at that concentration to efficiently overcome the exciton binding energy. The remaining quantum efficiency beyond this concentration likely stems from a combination of field- and temperature-driven dissociation. The energy available for exciton dissociation was estimated by subtracting the interface gap (calculated from the V$_{OC}$) from the optical bandgap, yielding exciton binding energies of about 0.55 eV for 1 and about 0.40 eV for 2, which is close to other reported values in organic molecules (from 0.2 to 1.4 eV). These exciton binding energies make up roughly 50% of the optical bandgap (about 0.8 eV), limiting the interface gap (and therefore V$_{OC}$) to modest values at which efficient exciton dissociation can still take place, despite the ability to achieve higher V$_{OC}$s. Moving forward, several strategies can be explored to decrease the exciton binding energy. For example, molecular modifications can be designed to enhance the delocalization of the electron/hole orbitals to increase the exciton radius, e.g., via central methine substitution. Another design strategy involves the coupling of smaller solubilizing groups or anions that allow for denser packing to increase the dielectric constant. Thus, this presents an interesting design challenge for the future optimization of very small bandgap organic photoactive devices.

To understand the ultimate potential of these material sets in photovoltaic applications, the EQE of a device with a 100 nm thick 2-TPFB layer having an exciton diffusion length of 100 nm, a 20 nm thick C$_{60}$ layer, and charge transfer and charge collection efficiencies approaching 100% was modeled. Such a device would have an EQE of about 70-80% with a J$_{SC}$ on the order of 25 mA/cm$^2$, and could be realized using a bulk heterojunction architecture and optimized energy level tuning. FF values can be increased from about 0.3 to about 0.65 (achievable for many organic systems) by optimizing the interface energetics or the modification of solvent processing conditions. Combined with a slightly improved $V_{OC}$ of 0.55 V, which is around the Shockley-Queisser excitonic limit, ideal devices would be 10% efficient with high transparency and would be well suited for multijunction cells with complimentary absorption.

These salt-based devices are also shown to be viable for near infrared photodetectors. Photodetector devices were fabricated with the same photovoltaic structure as those above. Specific detectivity (D*) curves for each salt are plotted in FIG. 20, where D* is proportional to the EQE and inversely proportional to the differential resistance at zero bias. Calculated D*s are comparable to those of the limited reports in other organic systems and reach values of $6.5 \times 10^{10}$ Jones at $\lambda=1140$ nm and $1.7 \times 10^{10}$ Jones at $\lambda=1390$ nm for 1- and 2-salts respectively. These observations compare well to the very limited reports in organic systems, such as porphyrin tapes ($2.3 \times 10^{10}$ Jones at $\lambda=1350$ nm) and inorganic carbon nanotubes ($8.8 \times 10^{11}$ Jones at $\lambda=1350$ nm). Exchanging the anion from 1-BF$_4$ to 1-TPFB increases the detectivity by an order of magnitude from $3.7 \times 10^9$ to $5.3 \times 10^{10}$ Jones, largely due to lower noise currents for devices with the TPFB anion. Compared to other organic systems, heptamethine salts have readily tunable properties via counterion or ligand exchange in addition to being easy to synthesize and fabricate. Moreover, they exhibit both broader and wavelength-specific photoresponsivity, which is promising for a range of applications in the near-infrared and visibly transparent photodetectors.

In summary, simple organic salts with unusually low bandgaps (0.8 eV) for infrared photoresponsivity extending to 1600 nm have been demonstrated. These salts are demonstrated in both photovoltaics and photodetectors and obtain peak NIR EQEs approaching 5% with standard fullerene acceptors. Performing counterion exchanges on these heptamethine salts is shown to increase the interface gap—along with $V_{OC}$, dark saturation current, and D*—with an eventual tradeoff in the exciton dissociation and quantum efficiency due to the modest exciton binding energies (from about 0.4 to about 0.55 eV). Nonetheless, anion exchange and alloying allow for facile tuning of the interface gap and provide interesting insight into the binding energies of these very small bandgap salts. These heptamethine salts represent a new approach to extend the range of NIR photoresponsive devices and enable new routes to the development of low cost infrared detectors and high efficiency multijunction cells.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A photo-active device comprising:
   a substrate;
   a first electrode disposed on at least one surface of the substrate;
   an active layer comprising an organic salt comprising a counterion selected from the group consisting of halides, aryl borates, carboranes, phosphates, fluoroantimonates, fluoroborates, derivatives thereof, and combinations thereof, wherein the phosphates do not include fluorophosphates; and
   a second electrode,
   wherein the active layer is positioned between the first electrode and the second electrode.

2. The photo-active device according to claim 1, wherein the organic salt comprises a polymethine ion or a cyanine ion.

3. The photo-active device according to claim 1, wherein the organic salt comprises an ion selected from the group consisting of 1-Butyl-2-(2-[3-[2-(1-butyl-1H-benzo[cd]indol-2-ylidene)-ethylidene]-2-phenyl-cyclopent-1-enyl]-vinyl)-benzo[cd]indolium, 1-Butyl-2-(2-[3-[2-(1-butyl-1H-benzo[cd]indol-2-ylidene)-ethylidene]-2-chloro-cyclohex-1-enyl]-vinyl)-benzo[cd]indolium, 1-Butyl-2-(2-[3-[2-(1-butyl-1H-benzo[cd]indol-2-ylidene)-ethylidene]-2-phenyl-cyclohex-1-enyl]-vinyl)-benzo[cd]indolium, 1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium, 1-Butyl-2-[7-(1-butyl-1H-benzo[cd]indol-2-ylidene)-hepta-1,3,5-trienyl]-benzo[cd]indolium, 2-[2-[2-chloro-3-[2-(1,3-dihydro-3,3-dimethyl-1-ethyl-2H-benz[e]indol-2-ylidene)ethylidene]-1-cyclohexen-1-yl]-ethenyl]-3,3-dimethyl-1-ethyl-1H-benz[e]indolium (Cy+), N,N,N',N'-Tetrakis-(p-di-n-butylaminophenyl)-p-benzochinon-bis-immonium, 4-[2-[2-Chloro-3-[(2,6-diphenyl-4H-thiopyran-4-ylidene)ethylidene]-1-cyclohexen-1-yl]ethenyl]-2,6-diphenylthiopyrylium, 1-Butyl-2-[2-[3-[(1-butyl-6-chlorobenz[cd]indol-2(1H)-ylidene)ethylidene]-2-chloro-5-methyl-1-cyclohexen-1-yl]ethenyl]-6-chlorobenz[cd]indolium, 1-Butyl-2-[2-[3-[(1-butyl-6-chlorobenz[cd]indol-2(1H)-ylidene)ethylidene]-2-chloro-1-cyclohexen-1-yl]ethenyl]-6-chlorobenz[cd]indolium, Dimethyl{4-[1,7,7-tris(4-dimethylaminophenyl)-2,4,6-heptatrienylidene]-2,5-cyclohexadien-1-ylidene}ammonium, 5,5'-Dichloro-11-diphenylamino-3,3'-diethyl-10,12-ethylenethiatricarbocyanine, 2-[2-[2-Chloro-3-[2-(1,3-dihydro-1,1,3-trimethyl-2H-benzo[e]-indol-2-ylidene)-ethylidene]-1-cyclohexen-1-yl]-ethenyl]-1,1,3-trimethyl-1H-benzo[e]indolium, 2-[2-[2-Chloro-3-[2-(1,3-dihydro-1,3,3-trimethyl-2H-indol-2-ylidene)-ethylidene]-1-cyclopenten-1-yl]-ethenyl]-1,3,3-trimethyl-3H-indolium, 2-[2-[3-[(1,3-Dihydro-3,3-dimethyl-1-propyl-2H-indol-2-ylidene)ethylidene]-2-(phenylthio)-1-cyclohexen-1-yl]ethenyl]-3,3-dimethyl-1-propylindolium, 1,1',3,3,3',3'-4,4',5,5'-di-benzo-2,2'-indotricarbocyanine perchlorate, 2-[2-[2-Chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium, 3,3'-Diethylthiatricarbocyanine, 2-[[2-[2-[4-(dimethylamino)phenyl]ethenyl]-6-methyl-4H-pyran-4-ylidene]methyl]-3-ethyl, 2-[7-(1,3-Dihydro-1,3,3-trimethyl-2H-indol-2-ylidene)-1,3,5-heptatrienyl]-1,3,3-trimethyl-3H-indolium, derivatives thereof, and combinations thereof.

4. The photo-active device according to claim 1, wherein the counterion comprises an aryl borate selected from the group consisting of tetraphenylborate, tetra(p-tolyl)borate, tetrakis(4-biphenylyl)borate, tetrakis(1-imidazolyl)borate, tetrakis(2-thienyl)borate, tetrakis(4-chlorophenyl)borate, tetrakis(4-fluorophenyl)borate, tetrakis(4-tert-butylphenyl) borate, tetrakis(pentafluorophenyl)borate (TPFB), tetrakis [3,5-bis(trifluoromethyl)phenyl]borate (TFMPB), [4-[bis(2,4,6-trimethylphenyl)phosphino]-2,3,5,6-tetrafluorophenyl] hydrobis(2,3,4,5,6-pentafluorophenyl)borate, [4-di-tertbutylphosphino-2,3,5,6-tetrafluorophenyl]hydrobis(2,3,4,5,6-pentafluorophenyl)borate, derivatives thereof, and combinations thereof.

5. The photo-active device according to claim 1, wherein the counterion is a phosphate selected from the group consisting of (∧,R)-(1,1'-binaphthalene-2,2'diolato)(bis(tetrachlor-1,2-benzenediolato)phosphate(V)) (BINPHAT), [Δ-tris(tetrachloro-1,2-benzenediolato)phosphate(V)] (TRISPHAT), derivatives thereof, and combinations thereof.

6. The photo-active device according to claim 1, wherein the active layer further comprises a complementary electron donor or electron acceptor.

7. The photo-active device according to claim 1, wherein the first electrode and the second electrode individually have a thickness of from about 1 nm to about 500 nm.

8. The photo-active device according to claim 1, wherein the active layer comprises a plurality of different counterions comprising the counterion and a second counterion selected from the group consisting of halides, aryl borates, carboranes, phosphates, fluoroantimonates, fluorophosphates, fluoroborates, derivatives thereof, and combinations thereof.

9. The photo-active device according to claim 1, wherein the device is a photovoltaic that has an open circuit voltage that is within 30% of the excitonic limit.

10. The photo-active device according to claim 1, wherein the device is a photovoltaic that has an open circuit voltage that is within 20% of the excitonic limit.

11. The photo-active device according to claim 1, wherein the photo-active device is visibly transparent.

12. The photo-active device according to claim 1, wherein the organic salt selectively or predominantly harvests light in the near infrared or infrared regions of the solar spectrum, or both.

13. The photo-active device according to claim 1, further comprising:
a complementary layer comprising an electron donor or an electron acceptor.

14. The photo-active device according to claim 1, wherein the device is integrated into a multijunction device architecture as a subcell.

15. A photo-active device comprising:
an active layer comprising an organic salt having either a polymethine ion or a cyanine ion, and a counterion selected from the group consisting of halides, aryl borates, carboranes, fluoroantimonates, phosphates, fluoroborates, derivatives thereof, and combinations thereof, wherein the phosphates do not include fluorophosphates.

16. The photo-active device according to claim 15, further comprising:
a first electrode; and
a second electrode,
wherein the active layer is positioned between the first electrode and the second electrode.

17. The photo-active device according to claim 15, wherein the ion is 2-[2-[2-chloro-3-[2-(1,3-dihydro-3,3-dimethyl-1-ethyl-2H-benz[e]indol-2-ylidene)ethylidene]-1-cyclohexen-1-yl]-ethenyl]-3,3-dimethyl-1-ethyl-1H-benz[e]indolium, 1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium, 1-Butyl-2-(2-[3-[2-(1-butyl-1H-benzo[cd]indol-2-ylidene)-ethylidene]-2-phenyl-cyclopent-1-enyl]-vinyl)-benzo[cd]indolium, or a combination thereof, and the counterion is selected from the group consisting of iodide (I⁻), tetrafluoroborate ($BF_4^-$), hexafluorophosphate ($PF_6^-$), hexafluoroantimonate ($SbF_6^-$), [Δ-tris(tetrachloro-1,2-benzenediolato)phosphate(V)] (TRISPHAT), tetrakis(4-tert-butylphenyl)borate, tetrakis(pentafluorophenyl)borate (TPFB), tetrakis[3,5-bis(trifluoromethyl)phenyl]borate (TFMPB), (∧, R)-(1,1'-binaphthalene-2,2'diolato)(bis(tetrachlor-1,2-benzenediolato)phosphate(V)) (BINPHAT), and combinations thereof.

18. The photo-active device according to claim 15, wherein the photo-active device is a photovoltaic or a photodetector.

19. The photo-active device according to claim 15, wherein the counterion is (∧,R)-(1,1'-binaphthalene-2,2'diolato)(bis(tetrachlor-1,2-benzenediolato)phosphate(V)) (BINPHAT), [Δ-tris(tetrachloro-1,2-benzenediolato)phosphate(V)] (TRISPHAT), derivatives thereof, or combinations thereof.

20. A photo-active device comprising:
a substrate;
a first electrode disposed on at least one surface of the substrate;
an active layer comprising an organic salt comprising a counterion selected from the group consisting of halides, aryl borates, carboranes, phosphates, fluoroantimonates, fluoroborates, derivatives thereof, and combinations thereof, wherein the phosphates do not include fluorophosphates; and
a second electrode,
wherein the active layer is positioned between the first electrode and the second electrode, and
wherein the photo-active device has an open circuit voltage that is within 30% of the excitonic limit.

* * * * *